US009589079B2

(12) United States Patent
Morse et al.

(10) Patent No.: US 9,589,079 B2
(45) Date of Patent: Mar. 7, 2017

(54) METHODS AND SYSTEMS FOR DESIGNING PHOTOVOLTAIC SYSTEMS

(71) Applicant: SunEdison Energy India Private Limited, Chennai (IN)

(72) Inventors: Andrew Joseph Morse, Sykesville, MD (US); Nagendra Srinivas Cherukupalli, Saratoga, CA (US); Ravi Ranganathan, Chennai (IN); Krishnan Ramagopal, Chennai (IN)

(73) Assignee: SunEdison, Inc., Maryland Heights, MO (US)

( * ) Notice: Subject to any disclaimer, the term of this patent is extended or adjusted under 35 U.S.C. 154(b) by 0 days.

(21) Appl. No.: 14/543,546

(22) Filed: Nov. 17, 2014

(65) Prior Publication Data

US 2016/0140258 A1 May 19, 2016

(51) Int. Cl.
*G06F 17/50* (2006.01)
*G06Q 10/04* (2012.01)
*G06Q 50/06* (2012.01)

(52) U.S. Cl.
CPC ...... *G06F 17/5004* (2013.01); *G06F 17/5009* (2013.01); *G06F 17/5081* (2013.01); *G06Q 10/04* (2013.01); *G06Q 50/06* (2013.01)

(58) Field of Classification Search
CPC .. G06F 17/5004; G06F 17/50; G06F 17/5009; G06F 17/5036; G06F 2217/78; G06F 2217/80; F24J 2200/04; H01L 27/112; H01L 27/11253; H01L 27/11807
USPC .................................................. 716/118–125
See application file for complete search history.

(56) References Cited

U.S. PATENT DOCUMENTS

| 8,191,018 B1 * | 5/2012 | Molesa ............... H05K 3/0005 382/141 |
| 2009/0234692 A1 | 9/2009 | Powell et al. |
| 2010/0175033 A1 * | 7/2010 | Adel ........................ G03F 7/705 716/52 |
| 2012/0035887 A1 | 2/2012 | Augenbraun et al. |
| 2013/0061198 A1 | 3/2013 | Brier et al. |

(Continued)

FOREIGN PATENT DOCUMENTS

EP 1677240 A2 7/2006

OTHER PUBLICATIONS

International Search Report and Written Opinion of the International Searching Authority regarding PCT/US2015/061156 mailed on Mar. 9, 2016; 15 pgs.

*Primary Examiner* — Binh Tat
(74) *Attorney, Agent, or Firm* — Armstrong Teasdale LLP

(57) ABSTRACT

A method for designing a photovoltaic (PV) system is implemented by a design automation computer system. The method includes receiving a set of site data, receiving a system type selection, receiving a plurality of system component selections, receiving a plurality of PV layout preferences, determining a PV module layout by iteratively applying a first layout algorithm to the set of site data and the plurality of PV layout preferences, the PV module layout defining a placement of a plurality of PV modules of a PV system, determining a structural layout, an electrical design, and an electrical layout based on the PV module layout, determining a bill of materials based on the PV module layout, the structural layout, and the electrical layout, and designing the PV system using the structural layout, the electrical design, the electrical layout, the PV module layout, and the bill of materials.

22 Claims, 19 Drawing Sheets

(56) References Cited

U.S. PATENT DOCUMENTS

2013/0159956 A1    6/2013   Verghese et al.
2014/0025343 A1    1/2014   Gregg et al.
2014/0032178 A1    1/2014   Kicinski et al.
2014/0331198 A1* 11/2014   Bischoff ................ G06F 17/50
                                                                                  716/135

* cited by examiner

METHODS AND SYSTEMS FOR DESIGNING PHOTOVOLTAIC SYSTEMS

FIELD

The field of the disclosure relates generally to the design of photovoltaic systems. More particularly, this disclosure relates to methods and systems to facilitate the automated design of photovoltaic systems.

BACKGROUND

Designing and optimizing photovoltaic (PV) systems may be a complex and time-consuming process. Effective design incorporates a variety of data including location specific data, system type data, PV module data, design data, and layout data. Collecting such data may be a complex task. Further, a variety of calculations and modeling tools must be used to effectively design and optimize such systems. Systems and methods for simplifying such design and automation may be desirable.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a method for designing a photovoltaic (PV) system is provided. The method is implemented by a design automation computer system in communication with a memory. The method includes receiving a set of site data, wherein the site data includes a set of location identifiers. The method also includes receiving a system type selection, receiving a plurality of system component selections, and receiving a plurality of PV layout preferences. The method further includes determining, at the design automation computer system, a PV module layout by iteratively applying a first layout algorithm to the set of site data and the plurality of PV layout preferences, the PV module layout defining a placement of a plurality of PV modules of a PV system. The method additionally includes determining a structural layout, an electrical design, and an electrical layout based on the PV module layout, determining a bill of materials based on the PV module layout, the structural layout, and the electrical layout, and defining a PV system model using the structural layout, the electrical design, the electrical layout, the PV module layout, and the bill of materials.

In another aspect, a design automation computer system for designing a photovoltaic (PV) system is provided. The design automation computer system includes a processor and a memory coupled to the processor. The design automation computer system is configured to receive a set of site data, wherein the site data includes a set of location identifiers, receive a system type selection, receive a plurality of system component selections, receive a plurality of PV layout preferences, determine a PV module layout by iteratively applying a first layout algorithm to the set of site data and the plurality of PV layout preferences, the PV module layout defining a placement of a plurality of PV modules of a PV system, determine a structural layout, an electrical design, and an electrical layout based on the PV module layout, determine a bill of materials based on the PV module layout, the structural layout, and the electrical layout, and define a PV system model using the structural layout, the electrical design, the electrical layout, the PV module layout, and the bill of materials.

Another aspect of the present disclosure is a computer-readable storage media for designing a photovoltaic (PV) system, the computer-readable storage media having non-transitory, computer-executable instructions embodied thereon. When executed by a design automation computer system comprising a processor and a memory coupled to the processor, the computer-executable instructions cause the design automation computer system to receive a set of site data, wherein the site data includes a set of location identifiers, receive a system type selection, receive a plurality of system component selections, receive a plurality of PV layout preferences, determine a PV module layout by iteratively applying a first layout algorithm to the set of site data and the plurality of PV layout preferences, the PV module layout defining a placement of a plurality of PV modules of a PV system, determine a structural layout, an electrical design, and an electrical layout based on the PV module layout, determine a bill of materials based on the PV module layout, the structural layout, and the electrical layout, and define a PV system model using the structural layout, the electrical design, the electrical layout, the PV module layout, and the bill of materials.

A further aspect of the present disclosure is a computer-implemented method for constructing a photovoltaic (PV) system. The method is implemented by a design automation computer system including a processor and a memory coupled to the processor. The method includes receiving a set of site data, wherein the site data includes a set of location identifiers, receiving a system type selection, receiving a plurality of system component selections, receiving a plurality of PV layout preferences, determining, at the design automation computer system, a PV module layout by iteratively applying a first layout algorithm to the set of site data and the plurality of PV layout preferences, the PV module layout defining a placement of a plurality of PV modules of a PV system, determining a structural layout, an electrical design, and an electrical layout based on the PV module layout, determining a bill of materials based on the PV module layout, the structural layout, and the electrical layout, creating a plurality of PV system options using the structural layout, the electrical design, the electrical layout, the PV module layout, and the bill of materials, providing the plurality of PV system options to a user device, receiving a PV system selection corresponding to one of the plurality of PV system options, and constructing the PV system based on the PV system selection.

An additional aspect of the present disclosure is a computer-implemented method for determining boundary offsets in a photovoltaic (PV) system based on shadow simulations. The method is implemented by a design automation computer system in communication with a memory. The method includes identifying a set of obstructions wherein the set of obstructions includes a set of obstruction elevations and a set of obstruction offsets, simulating a set of shadow effects using a first coarse shadow algorithm based on the set of obstructions, refining the set of shadow effects using a second fine shadow algorithm based on the set of obstructions and the set of shadow effects, and defining a plurality of boundary of boundary offsets based on the refined set of shadow effects.

A further aspect of the present disclosure is a design automation computer system for determining boundary offsets in a photovoltaic (PV) system based on shadow simulations. The design automation computer system includes a processor and a memory coupled to the processor. The design automation computer system is configured to identify a set of obstructions wherein the set of obstructions includes a set of obstruction elevations and a set of obstruction offsets, simulate a set of shadow effects using a first coarse shadow algorithm based on the set of obstructions, refine the set of shadow effects using a second fine shadow algorithm based on the set of obstructions and the set of shadow effects, and define a plurality of boundary of boundary offsets based on the refined set of shadow effects.

Yet another aspect of the present disclosure is a computer-readable storage media for determining boundary offsets in a photovoltaic (PV) system based on shadow simulations. The computer-readable storage media has non-transitory, computer-executable instructions embodied thereon. When executed by a design automation computer system comprising a processor and a memory coupled to the processor, the computer-executable instructions cause the design automation computer system to identify a set of obstructions wherein the set of obstructions includes a set of obstruction elevations and a set of obstruction offsets, simulate a set of shadow effects using a first coarse shadow algorithm based on the set of obstructions, refine the set of shadow effects using a second fine shadow algorithm based on the set of obstructions and the set of shadow effects, and define a plurality of boundary of boundary offsets based on the refined set of shadow effects.

A further aspect of the present disclosure is a computer-implemented method for determining a system layout of a photovoltaic (PV) system. The method is implemented by a design automation computer system in communication with a memory. The method includes receiving a first selection of a system table, receiving a layout mode designation, identifying a system orientation, identifying a system spacing, receiving a layout detail designation, and applying a layout algorithm based on the first selection of a system table, the layout mode designation, the layout mode designation, the system orientation, the system spacing and the layout detail designation.

A further aspect of the present disclosure is a design automation computer system for determining a system layout of a photovoltaic (PV) system. The design automation computer system includes a processor and a memory coupled to the processor. The design automation computer system is configured to receive a first selection of a system table, receive a layout mode designation, identify a system orientation, identify a system spacing, receive a layout detail designation, and apply a layout algorithm based on the first selection of a system table, the layout mode designation, the layout mode designation, the system orientation, the system spacing and the layout detail designation.

Yet another aspect of the present disclosure is a computer-readable storage media for determining a system layout of a photovoltaic (PV) system. The computer-readable storage media has non-transitory, computer-executable instructions embodied thereon. When executed by a design automation computer system comprising a processor and a memory coupled to the processor, the computer-executable instructions cause the design automation computer system to receive a first selection of a system table, receive a layout mode designation, identify a system orientation, identify a system spacing, receive a layout detail designation, and apply a layout algorithm based on the first selection of a system table, the layout mode designation, the layout mode designation, the system orientation, the system spacing and the layout detail designation.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

Figure 1:
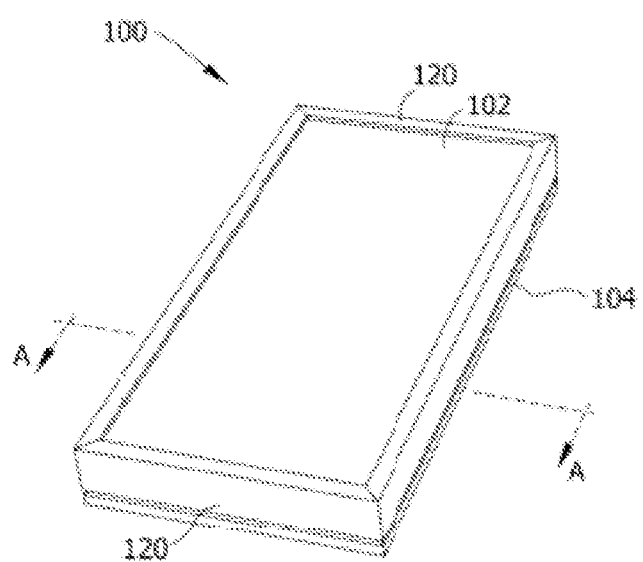
FIG. 1 is a perspective view of an example photovoltaic (PV) module.

Computer systems, such as design automation computer systems, may include a processor and a memory. However, any processor in a computer device referred to herein may also refer to one or more processors wherein the processor may be in one computing device or a plurality of computing devices acting in parallel. Additionally, any memory in a computer device referred to may also refer to one or more memories, wherein the memories may be in one computing device or a plurality of computing devices acting in parallel.

As used herein, a processor may include any programmable system including systems using micro-controllers, reduced instruction set circuits (RISC), application specific integrated circuits (ASICs), logic circuits, and any other circuit or processor capable of executing the functions described herein. The above examples are example only, and are thus not intended to limit in any way the definition and/or meaning of the term "processor." The term "database" may refer to either a body of data, a relational database management system (RDBMS), or to both. A database may include any collection of data including hierarchical databases, relational databases, flat file databases, object-relational databases, object oriented databases, and any other structured collection of records or data that is stored in a computer system. The above are only examples, and thus are not intended to limit in any way the definition and/or meaning of the term database. Examples of RDBMS's include, but are not limited to including, Oracle® Database, MySQL, IBM® DB2, Microsoft® SQL Server, Sybase®, and PostgreSQL. However, any database may be used that enables the systems and methods described herein. (Oracle is a registered trademark of Oracle Corporation, Redwood Shores, Calif.; IBM is a registered trademark of International Business Machines Corporation, Armonk, N.Y.;

Microsoft is a registered trademark of Microsoft Corporation, Redmond, Wash.; and Sybase is a registered trademark of Sybase, Dublin, Calif.)

In one embodiment, a computer program is provided, and the program is embodied on a computer readable medium. In an example embodiment, the system is executed on a single computer system, without requiring a connection to a server computer. In a further embodiment, the system is run in a Windows® environment (Windows is a registered trademark of Microsoft Corporation, Redmond, Wash.). In yet another embodiment, the system is run on a mainframe environment and a UNIX® server environment (UNIX is a registered trademark of X/Open Company Limited located in Reading, Berkshire, United Kingdom). The application is flexible and designed to run in various different environments without compromising any major functionality. In some embodiments, the system includes multiple components distributed among a plurality of computing devices. One or more components may be in the form of computer-executable instructions embodied in a computer-readable medium.

As used herein, an element or step recited in the singular and proceeded with the word "a" or "an" should be understood as not excluding plural elements or steps, unless such exclusion is explicitly recited. Furthermore, references to "example embodiment" or "one embodiment" of the present disclosure are not intended to be interpreted as excluding the existence of additional embodiments that also incorporate the recited features.

As used herein, the terms "software" and "firmware" are interchangeable, and include any computer program stored in memory for execution by a processor, including RAM memory, ROM memory, EPROM memory, EEPROM memory, and non-volatile RAM (NVRAM) memory. The above memory types are example only, and are thus not limiting as to the types of memory usable for storage of a computer program.

As used herein, "geographic site" refers to the location in which a designed PV system may be located. As discussed herein, the entirety of the geographic site may not be used because of, for example, obstructions, boundary offsets, shadow setbacks, and partitioning of the geographic site into sub-sites.

The embodiments described generally relate to automated design of photovoltaic ("PV") systems. More particularly, the embodiments described relate to methods and systems for facilitating automated analysis and simulations to design PV systems. The methods described herein are implemented by a design automation computer system. The methods described herein include (i) receiving a set of site data, wherein the site data includes a set of location identifiers, (ii) receiving a system type selection, (iii) receiving a plurality of system component selections, (iv) receiving a plurality of PV layout preferences, (v) determining, at the design automation computer system, a PV module layout by iteratively applying a first layout algorithm to the set of site data and the plurality of PV layout preferences, the PV module layout defining a placement of a plurality of PV modules of a PV system, (vi) determining a structural layout, an electrical design, and an electrical layout based on the PV module layout, (vii) determining a bill of materials based on the PV module layout, the structural layout, and the electrical layout, and (viii) designing the PV system using the structural layout, the electrical design, the electrical layout, the PV module layout, and the bill of materials.

As used herein, the structural layout, the electrical design, the electrical layout, the PV module layout, and the bill of materials may all be referred to as creating a general system layout or a "PV system model." The PV system model substantially defines a representation of the designed PV system.

Designing photovoltaic (PV) systems is a complex process. A variety of disparate data sets must be brought together and analyzed. Further, a variety of distinct decisions must be made in PV system design including, for example, geographic site selection, system component selection, and layout preference selection. Each decision may cascade and affect the available options for other decisions. Ultimately, designers of PV systems additionally consider the logistical and economic prospects of designed systems. Due to such voluminous data and numerous choices, effectively identifying preferable PV system designs is a significant challenge.

Accordingly, the design automation computer system described herein is configured to facilitate the design of PV systems. In the example embodiment, the design automation computer system is in communication with external systems as described below. Such external systems allow the design automation computer system to access external databases and leverage programs and algorithms of such external systems. The design automation computer system may communicate with such external systems via any networking method. Further, as described herein, the design automation computer system may be in communication with other devices including user devices. In an example embodiment, users designing PV systems access the design automation computer system via such user devices. The user devices access the design automation computer system over a network and may function in a client-server relationship wherein the user device is a client and the design automation computer system is a server. In further examples, users may directly access the design automation computer system via any suitable interface. In additional examples, the design automation computer system may substantially represent a cloud-based resource available to a plurality of user devices.

In the example embodiment, users access the design automation computer system using a graphical user interface ("GUI"). Because PV system design involves simulation of the conditions of the PV system (e.g., illustrating solar activity and shadows), the GUI may be useful for illustrating such simulations.

More specifically, as described herein, the systems described may operate in conjunction with modeling software and three-dimensional modeling software. In one example, the design automation computer system may integrate with such modeling software. The design automation computer system may also export and import design files from and to such modeling software. Such design files may be imported or exported in any suitable format including a CAD format.

In some examples, the design automation computer system is configured to define three-dimensional attributes and positions of all site features (e.g., site boundaries, obstructions, rows, and aisles) including heights of such features. Further, the design automation computer system may be able to simulate shadow effects for features of the site and accordingly develop a "shadow profile" to define the usable area of the site. Additionally, the design automation computer system may generate the PV model layout in three-dimensions. Further, the design automation computer system may run additional shadow simulations upon completion of layout to determine how height and tilt of PV modules in the layout are shaded at a given date and time (and a given sun position). Moreover, the design automation computer system is configured to allow a user to place components in the model including electrical and structural equipment. Accordingly, the shade effects of such equipment may be considered and evaluated. The design automation computer system is also configured to create plan set drawings (including layouts and detailed views) from a variety of perspectives by rotating the perspective of the user in the three-dimensional environment. Also, the design automation computer system may facilitate the creation of line-of-sight studies to use with planning or zoning committees. The design automation computer system may also facilitate creating reflectivity studies to demonstrate the periods of time that the PV system will reflect light onto a region or regions. The design automation computer system further may facilitate creating three-dimensional rendered designs for customers to evaluate the design and aesthetics of the PV system.

In some examples, the defined designs of PV systems described herein may be represented in a specialized format known as a "netlist" format. The netlist format may be used to transmit information regarding the designed PV system or to quickly query the PV system regarding attributes and structure of the PV system. Such efficient transmission and querying may be useful for system maintenance and alerts. For example, field technicians may utilize the netlist format to quickly find a piece of equipment described in the PV system design (and the netlist representation thereof).

In the example embodiment, the netlist format includes two component sections. First, the netlist format includes a definitional section defining components included within a system and their respective properties. Second, the netlist format includes a hierarchical representation of the components from the point of interconnection down to each individual module. In the example embodiment, such hierarchical representation is provided in the netlist as a parent/child hierarchy wherein each component is a child of the next level of component above it. The top level parent is the PV system itself.

The design automation computer system may also utilize a command line interface ("CLI") to allow any command to be presented in a textual format (in addition to graphical commands that are usable by the GUI). In the design automation computer system, the CLI may also be used to run "batch" files that list multiple commands in succession. Accordingly, the commands of such batch files may be executed in succession. A user may therefore build a file of commands (e.g., table creation commands and layout commands) and use the file to generate multiple permutations of PV system designs, run simulations of energy production for each design, and identify the optimal design based on the permutations.

At initial setup, the design automation computer system receives a first set of site data. The set of site data represents a depiction of a geographic site considered as a location for the PV system. The set of site data may include drawings or renderings of the geographic site. In one example, the set of site data includes satellite images and terrain data. In a second example, the set of site data includes computer-aided design ("CAD") drawings indicating the features of the geographic site. In a third example, the set of site data may represent location identifiers including, for example, geographic coordinates such as latitude and longitude coordinates. In such examples, the design automation computer system may retrieve further data such as satellite images and terrain data by accessing an external system containing geospatial data.

The design automation computer system may also receive additional site features that are not included in the set of site data. For example, the geographic site may include a tree that is not visible or indicated in the set of site data. As the tree may be an obstruction relevant to the design of the PV system, the user may identify the obstruction and provide it to the design automation computer system.

The design automation computer system also receives a set of location identifiers. The set of location identifiers (e.g., latitude and longitude coordinates) substantially identify the physical location associated with the set of site data. In at least some examples, the set of location identifiers are provided explicitly from a user device. In other examples, the set of location identifiers is derived from the set of site data using any suitable method including, for example, image analysis and metadata analysis.

The design automation computer system also identifies a north angle for the set of site data. As used herein, the north angle is the angle between true north and the y-axis in a three-dimensional coordinate system that is used by the design automation computer system to create the site model. In some examples, the north angle may be automatically determined based on the set of location identifiers. In other examples, the north angle may be provided explicitly from a user device.

The design automation computer system determines a set of location design characteristics ("local design data") based on the set of site data. The local design data may be retrieved from a local database, an external system, or a plurality of external systems. Local design data may include, for example and without limitation, seismic load data, wind load data, snow load data, solar data, wetland area identification data, floodplain area identification data, soil data, and elevation data. Some examples of external systems that may be used to retrieve local design data include engineering society databases, government databases, and academic databases. In at least one example, the design automation computer system utilizes application program interfaces ("APIs") to access local design data from such external resources. In a further example, the design automation computer system aggregates local design data from a plurality of sources and stores such aggregated local design data at an associated local design database. Local design data may be beneficial in the design of PV systems, as described herein, to identify local variables and risks associated with the location of the set of site data. For example, a first location may be associated with high winds. When designing a parking canopy system in the first location, such high winds may shear PV modules from the canopy. Accordingly, structural components may be utilized to mitigate the risk of high winds. In a second example, a second location may be associated with regular flooding. When designing a ground mount system in the second location, structural components may be utilized to mitigate the risk of flooding.

The design automation computer system also receives a system type selection. More specifically, a user accessing the design automation computer system selects a type of PV system. In the example embodiment, the system type selection may be ground mount, rooftop, and/or parking canopy. In other examples, other system types may be selected and configured in manners consistent with those described herein.

In at least some examples, the design automation computer system also receives layout region identifications and designations. More specifically, a user may identify a portion of the geographic site associated with the set of site data for use with the designed PV system. In one example, the user may graphically identify a subsection of the geographic site that may be used. In further examples, the user may provide a name for the subsection. The user may design multiple PV systems in the same geographic site. Therefore, identifiers may be useful to distinguish each subsection associated with a distinct PV system.

The design automation computer system may also receive a set of boundary offsets associated with the set of site data. The set of boundary offsets identify areas which cannot be utilized in the layout of the PV system. Such boundary offsets may be chosen for logistical purposes (e.g., to allow maintenance crews to access the PV system easily) or any other reason. In one example, a rooftop system is selected and the boundary offset allows a walking path around the PV system for maintenance access. The set of boundary offsets may be identified graphically.

The design automation computer system additionally may receive a set of obstruction definitions associated with the set of site data. The set of obstruction definitions define any obstructions that are located at the geographic site. Examples of obstruction definitions may include obstruction locations, obstruction heights, and obstruction offsets. Obstruction locations and obstruction heights may be provided explicitly. Alternately, obstruction locations and obstruction heights may be determined by processing the set of site data using, for example, image analysis. In at least some examples, the design automation computer system may identify obstructions and obstruction heights without user input. Obstruction offsets reflect offsets associated with the obstruction. In at least some examples, obstruction offsets are determined because of maintenance requirements. In the example embodiment, obstruction offsets are provided by a user at a user device. Further, in the example embodiment, the design automation computer system avoids placing PV modules within obstruction offsets as such placement is inefficient.

Using the set of obstruction definitions, the design automation computer system determines a set of shadow setbacks. More specifically, the design automation computer system identifies the set of obstructions based on the set of obstruction definitions and projects shadow effects on the geographic site for a plurality of time periods. The design automation computer system identifies simulation time periods and identifies a projected sun location for each time period. Using the projected sun location, the design automation computer system projects the shadow effects of the sun and the set of obstructions on the geographic site. In at least some examples, the user provides the time periods (e.g., dates and times) for simulating such shadow effects. In further examples, multiple PV module heights may be simulated to show varying shadow effects based on the height of the PV modules. In such examples, the user may provide potential PV module heights.

Shadow Algorithms

In the example embodiment, the design automation computer system uses shadow algorithms to render shadow effects. The shadow algorithms are critical to determine solar PV generation as the yield of the PV system is affected if shadow falls on a functional solar panel. In order to ensure that the designer is able to maximize placement of solar modules with minimal shadow implications, several options are provided to the user of the design automation computer system, described below.

In a first example, shadow effects may be determined based on solstice. During winter and summer solstice the sun is at the lowest and highest point, respectively. In such an example, the shadow effects at winter and summer solstices are simulated for each of the days.

In a second example, the design automation computer system allows users to additionally specify additional days for simulating shadow effects. In some cases, users may simulate shadow effects during the spring and autumn equinox.

In other examples, the design automation computer system allows a user to simulate shadow effects for every day of the year. In some cases, such simulations may be performed using an automated scripting solution.

In a fourth example, the design automation computer system may simulate shadow effects for a particular time range within days. Typically, the effective yield from the sun for PV systems is between 9:00 AM and 3:00 PM. Before sunrise and after sunset, no solar generation occurs. In other words, the output of the PV system is significantly dependent on the time of day—further, in many examples obstructions may only create shadow effects at particular periods of the day. For example, if a particular obstruction casts a shadow after 2:30 PM, the design automation computer system may simulate shadow effects before this period to calculate yields and after this period to simulate shadow effects.

In a fifth example, the design automation computer system may make time zone adjustments for shadow effect simulations. As described above, in many PV systems, effective solar generation is between 9:00 AM and 3:00 PM. However, within a particular time zone, sun position may vary substantially for a particular time. For example, if a site is in a longitude of 75 degrees west, the sun position at 9:00 AM may be different from a site at 80 degrees west within the same time zone even though the clock time is the same. The design automation computer system may adjust for such intra-time zone variance by calculating the effective clock time for a site at a specific longitude. Thus, the effective clock time at the longitude of 75 degrees west will vary from the effective clock time of at 80 degrees west.

In a sixth example, the design automation computer system may simulate shadow effects based on table height settings. The vertical placement of PV modules may affect the shadow effects. For example, if PV modules are placed at a height of two feet above the ground, all obstructions having a height below two feet do not cause shadow effects on the PV modules. Accordingly, the design automation computer system may factor in the height of the tables to determine whether certain obstructions may be excluded from causing shadow effects.

Further, the design automation computer system may simulate shadow effects at various table heights to maximize effective placement of PV modules. For example, by simulating table heights at a variety of heights, the design automation computer system may determine that increasing the table height by a given amount (e.g., six inches) inches increases the effective placement area by ten percent and the overall yield by five percent. Accordingly, the design automation computer system may determine the preferable height of PV modules.

In a seventh example, the design automation computer system allows a user to simulate shadow effects at specific intervals between a start and an end time. In an example embodiment, the default interval is once every hour. Alternately, the design automation computer system may simulate shadow effects at a smaller interval (e.g., every 30 minutes). More frequent simulations may allow for a more accurate simulation, generally.

In the example embodiment, two shadow algorithms are used to render shadow effects. In a first example, a coarse algorithm is used. The coarse algorithm identifies obstructions based on the set of obstruction definitions and projects the shadow caused by each obstruction based on the projected sun position vector for each period in the simulated time period. The coarse shadow algorithm uses the sun position to project shadows caused by obstructions onto a ground face. For every interval from start time to end time of specific days of the year (as defined by the user) and during periods of the day (as defined by the user) at defined intervals, the sun position is determined.

For a specific sun position, a line drawn from the sun direction to each of the obstructions is used to determine shadow effects. The design automation computer system uses visible corners of each obstruction above the table height and determines the projection of each obstruction onto the ground based on the sun position.

The design automation computer system repeats the coarse algorithm for visible corners of each obstruction for every time interval within the start and end times for each of the days specified.

The design automation computer system further connects the points rendered on the ground with the base of the obstruction to determine multiple shadow regions. The shadow regions will often overlap between time intervals. The design automation computer system uses a union algorithm to join overlapping regions into a single region. The design automation computer system repeats the union algorithm until multiple contiguous regions of shadow are obtained.

In some cases, obstructions may have a large number of corners. In such examples, it may be difficult to perform a corner projection of each of the corners due to significant computational times. In such cases, the design automation computer system may determine an effective approximation to take the bounding box of such complex objects and use the bounding box corners for shadow rendering.

In such shadow effect simulations, various independent areas may be called regions. For example in a site with multiple buildings, each building rooftop may be treated as a region. Accordingly, the design automation computer system may substantially determine shadow effects (and all other aspects of PV design) with at a regional level.

In some examples, multiple regions may be identified within a site. In such a multi-region scenario, when simulating shadow effects for one region, other regions and associated obstructions may also render shadow effects onto the simulated region. Accordingly, shadow effects may be simulated across regions.

The design automation computer system may simulate shadow effects (i.e., apply shadow algorithms) on flat regions and on sloping, curved, or non-level regions including sloping roofs. In many examples, obstructions on sloping roofs such as vents or chimneys may cause shadow effects. The design automation computer system may determine shadow effects of such obstructions on such non-level surfaces.

Once the shadow effects and shadow areas are determined by the coarse algorithm, an additional process may be run to determine valid shadow areas. Specifically, the design automation computer system identifies shadow areas outside the selected region and removes such outside areas. Accordingly, only the shadow areas are rendered.

The design automation computer system renders the shadow areas in a shadow layer. The shadow layer grouping is used to allow a user to show or hide the layer based on a single input (e.g., a selection or a mouse click).

The shadow areas are also visually rendered at a slightly higher height than the ground region for display purposes. In other words, the shadow areas are rendered so that shadow regions may be distinguished from ground regions. In an example embodiment, the shadow areas are rendered at a scale depiction of one-quarter inch height above the ground region. Further, the design automation computer system may designate shadow areas by applying a different color to shadow areas to differentiate them from other site areas and geometry.

In the second example, a fine algorithm is applied to refine the output of the coarse algorithm. The fine algorithm may provide a more accurate shadow area representation and may also determine the approximation of complex objects as explained above. The fine algorithm performs sun position ray tests at short distance increments (e.g., less than 6 inches) in order to create higher resolution shadow effects. The fine algorithm therefore produces a more precise shadow effects through this detailed simulation.

In the fine algorithm, the design automation computer system utilizes a different approach for determining shadow effects as compared to the coarse algorithm. Specifically, the design automation computer system uses the shadow areas as determined in coarse algorithm and does a reverse shadow analysis. Each shadow area is broken into smaller squares and a beam of light is simulated from the center of the each square towards the direction of the sun at the same interval periods as used in the coarse algorithm. Accordingly, between the start and end times (at the specified interval for each of the days to be tested), the design automation computer system simulates sending a ray towards the sun position. The design automation computer system determines whether the ray intersects with an obstruction. If the ray intersects with an obstruction, the smaller square is verified as a shadow square (i.e., a square that is verified to have a shadow effect). This process may be repeated for all smaller squares for each shadow areas for specified days and times. The size of the smaller square may be determined by the size of the site and the amount of time it takes to compute the shadow. In many examples, a very large site may use larger squares while smaller sites may use smaller squares. In some examples, the maximum length of the side of each square is set to twelve inches to maintain accuracy. In some examples, the minimum length of the side of each square is limited one inch to maintain the efficiency of calculation.

In most embodiments, the coarse and fine algorithms are configured to be executed in a limited period of time on a user computing device such as a desktop or a laptop. However, in other examples, processing capabilities and time may not be as crucial and the square size may be decreased below one inch per side. Similarly, more frequent simulations may be used. In some examples, such simulations may be performed on a remote server accessible by a user computing device.

Once the shadow squares are determined, a union algorithm similar to that described above may be executed to combine all shadow regions into contiguous areas and all non-shadow regions into contiguous areas. Non-shadow contiguous areas may be deleted and the design automation computer system renders only shadow areas.

Similar to the coarse algorithm, the fine algorithm groups all shadow areas into a shadow layer for visibility, selection, and grouping. Further, also like the coarse algorithm, the fine algorithm may render shadow effects for non-level surfaces.

Additionally, also like the coarse algorithm, shadow areas may be rendered at a default height of one-quarter inch above the ground region in the fine algorithm. Additionally, the fine algorithm may distinguish shadow areas with distinct colors in a manner similar to the coarse algorithm.

In some examples, the shadow algorithm may allow users to place all solar panels in the entire usable area including possible shadow areas. In such examples, a process similar to the fine algorithm may be used to determine shadow effects on the solar panels placed in potential shadow areas. Solar panels may be partitioned into smaller squares and a simulated ray may be sent towards the sun position for each of the days between the start and end times for the specific days. The design automation computer system may then determine a number of points in shadow and a number of points outside shadow and further determine a ratio is of the points. The determined ratio may be used to determine the gradient color of the solar module. In some examples, the solar module may be rendered in red if it is fully under shadow for all the days and time intervals. Conversely, the solar module may be rendered in green if it is not in a shadow area at any point in the period. Thus, the solar module may be rendered in a varying color (on a gradient from red to green) if the modules are partially shaded at particular points.

As a result, the design automation computer system may render the solar modules to easily indicate highly shaded or fully shaded modules. Accordingly, a user may remove highly shaded or fully shaded solar modules from the design. In some examples, a numeric value associated with the gradient value may also be displayed. Further, the design automation computer system may provide a filter function to allow for removal of all solar modules with gradient values outside the boundary of the filter.

Shadow effects represent areas where PV systems will not yield optimal energy production (because of the temporary or total reduction in solar irradiance at the location). Accordingly, it may be undesirable to place PV modules where obstructions cause shadow effects. The design automation computer system therefore integrates the set of shadow effect areas into an integrated shadow setback area. The integrated shadow setback area is used as negative space to define where the PV modules should not be placed.

The design automation computer system also receives a plurality of system component selections. System component selections represent the selections of equipment that will be used by the PV system for energy production and transfer. Accordingly, in most examples, system components include PV modules, PV inverters, PV combiners, conductors, and conduits. In the example embodiment, the design automation computer system identifies potential system component selections from a component library. As used herein, the "component library" refers to a data store that catalogues components used in PV system design. The component library includes definitions and identifiers for system components, structural components, and electrical components. Further, the component library identifies which components may be used with other components. (In at least some examples, some system components may only be used with a subset of other available system components.) The component library may be stored in any suitable form.

In the example embodiment, the component library is stored in a database associated with the design automation computer system. In at least some examples, the component library also includes schematic information, safety information, pricing information, and maintenance information associated with components. In further examples, the component library may include estimated labor costs associated with components to identify the cost of, for example, installation and maintenance.

The design automation computer system provides a retrieved plurality of first system component options to a user device based on the component library. In other words, the design automation computer system presents system component options to the user based on the component library. Upon a component selection by the user, the design automation computer system receives a first system component selection corresponding to one of the plurality of first system component options from the user device. In the example embodiment, the first system component options represent a set of PV module options. In other examples, other components may first be presented to the user.

Upon receiving a first system component selection, the design automation computer system may constrain the available system component options based on the first system component selection. As described above, at least some components are associated with a subset of other components and therefore force a filtering of subsequent system component options. The design automation computer system accordingly retrieves a plurality of second system component options associated with the first system component selection from the component library. In other words, the design automation computer system provides a second set of component options from the component library based on the selection of the first set of component options as the first selection acts as a filter on the component library selections. For example, the first system component options may include a list of conductor types including "aluminum conductors." Upon selection of "aluminum conductors", the design automation computer system may provide a second set of component options from the component library representing all aluminum conductors noted in the component library. The design automation computer system presents the plurality of second system component options to the user device and receives a second system component selection corresponding to one of the plurality of second system component options from the user device. In the example embodiment, the second system component options represent a set of PV inverter options. In other examples, other components may secondly be presented to the user.

In a similar fashion, the design automation computer system may present a plurality of system component options to the user device until all system component options are identified for the purposes of PV system design. In other examples, only a subset of system components is selected and the design automation computer system automatically identifies suitable system components for the remainder of the PV system design. In an example embodiment, a user selects a PV module, a PV inverter, and a PV combiner and the design automation computer system automatically selects a conductor and a conduit.

The design automation computer system also defines a PV module layout. A PV module layout represents a physical layout of PV modules within the geographic site. In at least some examples, PV module layouts follow a hierarchical convention wherein a group of PV modules may be identified as a single unit known as a "table". A table typically has fixed dimensions in terms of PV modules. A table may further be grouped into a "block". Similarly, a block typically has fixed dimensions in terms of PV tables.

To define the PV module layout, the design automation computer system may receive a table identifier from the user device to distinguish tables. The design automation computer system further identifies a PV module type for the table, previously selected by the user.

The design automation computer system calculates a recommended "string size" for the PV system. A string size represents the amount of PV modules that may be wired in succession. The string size may be determined based on electrical and temperature considerations. The string size may also be used by the design automation computer system to determine the number of modules to be used in a table. As string sizes increase, potential open-circuit voltage outputs for the string similarly increase. The design automation computer system calculates the recommended string size by identifying and processing a plurality of variables. The design automation computer system identifies a proximate weather data source (e.g., an ASHRAE station) and receives meteorological data for the geographic site based from the proximate weather station. In the example embodiment, the received meteorological data includes record high and record low temperatures for the geographic site. The design automation computer system may be accessed using an associated API or a data feed. The design automation computer system also receives electrical properties including, but not limited to, open-circuit voltage for the identified PV module and maximum power point tracking ranges for the identified PV inverter. The values for such electrical properties may be retrieved from the component library.

Based on such electrical properties and meteorological data, the design automation computer system determines a recommended string size for the PV system. In the example embodiment, the recommended string size is the quantity of PV modules in a string that results in an open-circuit voltage that is within the maximum power point tracking range during record low and record high temperatures for the geographic site.

The design automation computer system provides the recommended string size to the user via the user device. The user may select the recommended string size or choose an alternate string size. In at least some embodiments, users may only select string sizes that result in open-circuit voltage that is within the maximum power point tracking range during record low and record low temperatures for the geographic site.

The design automation computer system also receives a selection of an amount of modules in the table. The selection may represent a selection of strings per table or a selection of modules per table.

The user may further define customized layout properties for the table. In at least some examples, such customized layout properties include PV module orientation, row counts, tilt angles of the PV module, and spacing between rows and columns of the PV table.

The PV string size selection, the selection of an amount of modules in the table, and the customized layout properties may be described as "PV layout preferences." Based on the PV layout preferences, the design automation computer system may define each PV table.

As noted above, PV tables may be grouped into PV blocks. The design automation computer system may receive a selection by the user to aggregate tables into blocks. Specifically, the design automation computer system may receive a selection of a defined PV table and a selection of the quantity and distribution of tables within the block. The design automation computer may further receive typical spacing between tables. Such spacing may be useful to facilitate maintenance of each table. Based on such user input, the design automation computer system defines PV blocks.

Depending upon the selected system type, the design automation computer system receives additional PV layout preferences. If the PV system is of a ground mount or rooftop type, the design automation computer system receives an additional distinct set of PV layout preferences. The design automation computer system receives a selection of one or more PV tables or PV blocks being used in the design. The design automation computer system also identifies whether the layout mode is "uniform" or "non-uniform". When the layout mode is uniform, the design automation computer system may substantially automate the layout by repeating PV module dimensions and spacing. When the layout mode is non-uniform, the design automation computer system places PV modules as close as possible to one another in order to maximize the energy output of the PV system. Accordingly, the uniform layout mode reflects a preference for a repeated spacing of PV modules while a non-uniform layout mode reflects a preference for maximum energy output. The design automation computer system also receives a layout alignment selection. The layout alignment selection represents the selection of the axial orientation of the PV modules by the user. Specifically, the design automation computer system receives an axial orientation from the user device. In the example embodiment, PV layout is along a north-south axis. In an alternative embodiment, the user device may transmit any suitable axis of orientation. In some embodiments, the design automation computer system may receive a user input to define the azimuth. For example, a user may select a site feature (e.g., a boundary edge of a site) and the design automation computer system may determine the azimuth based on the selected site feature and use the determined azimuth to define the axis of orientation. Based on the layout alignment selection, the design automation computer system calculates an azimuth value. The design automation computer system also determines a recommended spacing between rows of the PV tables. The recommended spacing may be determined by running a shade analysis algorithm to simulate shadow effects caused by each row of PV modules. In the example embodiment, the shade analysis algorithm is run over the winter and summer solstice periods between 10 AM and 2 PM. The row spacing is therefore determined by identifying the row spacing that allows for shade-free rows of PV modules in the simulated time periods. The design automation computer system receives a user selection for row and column spacing. The user may adopt the recommended spacing or select their own. The design automation computer system may receive additional spacing preferences from the user device. Such additional spacing preferences may be provided by the user for reasons including logistics and access. The design automation computer system receives the user selection for row and column spacing and the additional spacing preferences as received user spacing selections. In some examples, the user may additionally provide a maximum system size (or total system size) to indicate that the design automation computer system should not layout a system exceeding this defined system size. The design automation computer system also receives a layout detail selection. Layout detail substantially represents the amount of time that the design automation computer system may execute to identify PV layout options. A higher value of layout detail may yield a higher PV system size. However, a higher value of layout detail may require more time to process. Additionally, the design automation computer system may receive a layout region to identify the specific portion of the geographic site that may be used for defining PV layout options.

Layout Algorithm

In the described example (wherein the PV system type is ground mount or rooftop), the design automation computer system uses the site data and the plurality of PV layout preferences to determine the PV module layout. More specifically, the design automation computer system iteratively applies a plurality of layout algorithms to determine the PV module layout. In an example embodiment, the design automation computer system applies at least a first layout algorithm and a second layout algorithm. The first layout algorithm is applied to the set of site data and the plurality of PV layout preferences. The first layout algorithm is used to maximize placement of solar modules in a site given obstructions, shadow setbacks (and shadow effects) and boundary offsets. As described below, the second layout algorithm is used to iterate through the PV module layout and place structural components.

The first layout algorithm allows flexibility of user solar module placement by providing layout options including those described below. As a result, the design automation computer system allows a user to compare layouts based on the inputs provided.

In a first example, the design automation computer system provides a user options of tables or blocks to be used in the layout. As described above, tables are a collection of modules that are grouped together. Accordingly, tables allow for easy placement, particularly in large regions. Tables allow the rapid placement of groups of modules in large spaces. Tables also may have structural components defined within.

As used herein, a "string" describes a set of modules serially connected together. All direct current electrical connections in the PV world are based on strings. Strings may be connected to inverters and combiners.

As used herein, "string size" refers to the number of modules in a string. String size may be determined based on at least module, inverter, and location characteristics. Accordingly, groups of modules within a table may be determined based on string size. More specifically, modules may typically be grouped in multiples of a string size.

For smaller sites, to maximize solar module placement, tables may be created with a fraction of a string size because having tables with the entire string size (or multiples thereof) may result in wasted space. Tables may also be created with solar modules in the table in portrait or landscape mode (i.e., with varying aspects). Tables may also be created with multiple rows.

In the design automation computer system, tables may also be created with distinct types. In a first example, tables may be of a fixed tilt table type. In this example, modules may be placed in the east-west direction while facing south in the northern hemisphere and north in southern hemisphere. Each module may also be tilted at an angle. The tilt of each module may be calculated based on the latitude and longitude and direction of the sun in order to determine maximum solar energy yield. The tilt of each module may be fixed in some examples and variable in others. Accordingly, a user may select a fixed tilt table and identify an orientation and angle for modules in the table. Alternately, the orientation and/or angle may be determined by the design automation computer system automatically.

In a second example, tables may be of a tracker table type. In such examples, modules may be placed in a north-south direction and follow the sun during the day. As the sun rises in the east and sets in the west, tracker tables may be tilted by motors to follow the sun. Accordingly, tracker tables may have higher yields because the sun incidence on the module is typically perpendicular resulting in higher yields. Accordingly, the design automation computer system allows a user to designate a table as a tracker table.

In a third example, tables may be of a canopy table type. Canopy tables refer to table structures that may be placed on top of parking lot canopies. There are three sub-types of canopy tables: gable, Y-type and single tilt. As described, each sub-type may be associated with a varying parking canopy layout because parking canopies may be laid out in a variety of ways. Typically parking canopies have two horizontal spans at various angles. In some examples, one span may be horizontal and one span may be tilted. Alternately, both spans may be in a V-configuration. In additional examples, the spans may be in an inverted V-configuration. When the tilts are in a V-configuration, Y-type canopy tables may be appropriate. When the spans are in an inverted V configuration, gable type canopy tables may be appropriate. Both the gable and Y-type canopy tables are capable of supporting different angles for both spans. In a third example, the single tilt table type may be used when both spans may be treated as a single span with a single tilt.

As used herein, "blocks" may define another grouping of modules that is organizationally at a higher level grouping than tables. Blocks are typically composed of tables. In most examples, blocks are used on large ground mount sites. Blocks may be used to create a standardized set of components that are repeatable on large sites. Blocks typically include tables and associated components including inverters, combiners, and optional structures. In most examples, a large site may use identical blocks or similar blocks and place such blocks adjacent to one another. As described, blocks consist of tables placed in rows and columns with fixed spacing between the rows and columns. A user may define blocks by selecting a table to be used (as the underlying component), the block dimensions (i.e., the number of columns and number of rows of tables which constitute a block) and the spacing between the tables of the block.

The design automation computer system may also provide the option of selecting multiple tables for a layout. Multiple tables may be chosen based on certain criteria. For fixed tilt tables, multiple tables with the same dimensions in the north direction may be selected. Typically, fixed tilt tables with one quarter of a string size, one half a string size, and a full string size may be selected for layout. The first layout algorithm may use all the three tables to create a layout with maximum space used for layout.

For tracker tables, multiple tables with same dimension in the east-west direction may be selected for layout. For example, a single string table, two-string table and three-string table may be selected.

After selecting the tables (or multiple tables), the user may select a layout mode. The design automation computer system includes are two layout modes: a uniform layout mode and a non-uniform layout mode.

Uniform layout ensures rows of tables are placed in symmetrical fashion. If a user chooses multiple tables, the table with the largest dimension is used and placed sequentially in each row. If, in a particular row the second table cannot be placed due to an obstruction, that space is totally ignored and the table is placed in the third column as the previous rows. If the unused space can accommodate smaller tables without encroaching on the third column, the smaller tables are placed. If not, the space is ignored and tables are placed in equal intervals of largest table size. This mode of layout results in clean, well defined table layouts with clean pathways.

Non-uniform layout may be used in sites where the number of obstructions is high. In the non-uniform layout mode, tables are placed in a sequential fashion. If a larger dimension table cannot be placed a smaller table is placed. However, rather than move to the next column to place the next table like in uniform mode, the largest table is placed immediately next to the smaller table. Thus, the non-uniform layout mode results in densely packed tables but while lacking the symmetry of uniform layout mode. Non-uniform layout mode may be used if maximum yield is of paramount importance or if sites are highly obstructed.

The design automation computer system may receive a user specified azimuth angle value. Azimuth angle defines how the tables face the sun. For example, in the northern hemisphere, the azimuth value is 180° while in southern hemisphere the azimuth angle is 0°.

The design automation computer system allows a user to select one of the two options. The user may align to true south or align to off-azimuth. When aligning to true south is selected, the azimuth angle is 180° as explained above. When aligned to off-azimuth is selected, a user may specify an off-azimuth angle. Off-azimuth angle may be used in examples where a site is slightly slanted and is not facing south. Placing tables facing south on such a site may result in fewer numbers of placed tables due to the slant of the site. Therefore, by adjusting for the slight off-azimuth angle, the design automation computer system may align the tables to the site boundaries to obtain maximum table placement.

The design automation computer system may also allow a user to specify the north-south gap for layout. This is gap in the north-south directions between rows of tables. The north-south gap may be specified as a pitch value. "Pitch", as used herein, is defined as the distance between two successive tables in the north direction.

The north-south gap may also be specified as a ground coverage ratio ("GCR"). GCR, as used herein, is a ratio of the length of the table in north-south direction in comparison to the pitch. Thus, a GCR of 100% indicates that tables are placed in rows without any gap. Alternately, a GCR of 50% means the gap between tables in the north-south direction is equal to the length of the table. Therefore, in this case half the site is covered by tables.

Additionally, the design automation computer system allows for additional types of gaps. In some examples, a user may want to define roadways or pathways for vehicle movement within the site. The design automation computer system allows for the definition of such pathways using additional north-south gaps. The design automation computer system allows a user to choose such additional north-south gaps by specifying a gap for every specific number of tables in the north-south direction. For example, a ten foot gap every five tables would create a ten foot pathway running east to west after every five tables in the north-south direction.

The design automation computer system also allows a user to choose additional north-south gaps by specifying a gap after a specific distance. For example, if a ten foot gap every two hundred feet is specified, a ten foot gap is created every two hundred feet. However, if tables are placed such that a table exists at the two hundred foot point, the additional gap may be created after the placement of the table nearest the two hundred foot point.

The design automation computer system also allows a user to specify the east-west gap for layout. The east-west gap is a gap in the east-west direction between columns of tables. The east-west gaps may be defined and used in a similar manner as the north-south gaps.

The design automation computer system also allows a user to specify the maximum system size allowable for placement. In some examples, due to customer or regulatory constraints, it may be required that a particular site should not exceed a specific system size. Accordingly, a user may specify the maximum system size in at least two ways. In a first example, an "at least" mode will place tables whose total kilowatt direct current meets at least a specified value. For example, each table may be three kilowatts in size. If user specifies 250 kilowatts "at least", the design automation computer system will determine a layout including eighty four tables totaling 252 kilowatts.

In a second example, an "at most" mode will place tables whose total kilowatt direct current is at most the specified value. For example, each table is three kilowatts in size. If user specifies 250 kilowatts "at most", the design automation computer system will determine a layout including eighty four tables totaling 249 kilowatts.

The design automation computer system also allows a user to specify a start point. A start point denotes the starting place where tables are placed and the direction and orientation of table placement. Start point may be specified in multiple ways. A start point may be identified at an origin causing the design automation computer system to place tables starting at the lower left corner of the site.

User may also optionally specify the direction of table placement. By default, the design automation computer system places tables in an east-west direction and, upon completion of a row, moves to the next row and repeats the process.

In a second example, the user may designate a start point at the center of the site and the design automation computer system may start table placement at the center of site. While starting at the center, the user may specify that tables should be placed in the lower half of the site only. The user may then specify that table placement happens in east-west direction first for each row and moves only in the south direction afterwards.

In a third example, the user may choose a custom point on site as the start point. This is typically used to concentrate tables in one area of the site because a user has specified a maximum system size which is significantly smaller than what the site can accommodate. For example, if user has a large site which may accommodate one thousand kilowatts, but regulatory requirements require three hundred kilowatts only on this site, a user may potentially choose a region closest to a roadway to place modules in an accessible location.

The design automation computer system also allows the user to choose the type of "layout run". Layout run determines a level of detail for determining layouts. More specifically, layout runs designate the number of different start points to iterate through closest to the start point specified earlier. In the example embodiment, three types of layout runs are available: Quick Run, Normal Run, and Detailed Run. As indicated by the names, Quick Run includes the fewest numbers of start points, Normal Run includes an intermediate number of start points (including all of Quick Run start points), and Detailed Run includes the most start points (including all of Normal Run and Quick Run start points).

After the user chooses all the described inputs, the first layout algorithm uses the above inputs to layout tables. As described herein, various independent areas are called regions. For example in a site with multiple buildings, each building rooftop is treated as a region. Accordingly, the first layout algorithm may operate in a region-based manner.

The design automation computer system allows the user to choose a region to perform a layout. The first layout algorithm determines the direction of layout based on start point and directions specified. Additionally, the first layout algorithm determines the order of placement. Typically, it places tables in an east-west direction and then moves in the north direction and continues the process until the full site is completed or the maximum system size is achieved.

For certain types of tracker installations, the direction of table placement is in the north-south direction and then moves to the east and places the next set of tables in north-south direction.

The design automation computer system determines a direction of placement based upon a user selection for start point selection as explained above. For each start point, as determined by the layout run, tables are placed on the site sequentially in the requested direction. If a table can be placed without any obstruction or a shadow keep out intersecting it, the table is placed. The design automation computer system repeats such a process for each row and then it moves to the start of the next row. The design automation computer system determines the start of the next row based upon the pre-defined north-south gap. Accordingly, the design automation computer system places the tables in the second row.

The design automation computer system repeats such placement until the entire site is covered or the maximum system size is reached. In an example embodiment, the total number of tables, the corresponding input parameters associated with a layout, and table positions may be stored as a data structure on any storage suitable for later retrieval. Such a data structure may be referred to as a layout result set. The design automation computer system chooses the second start point closest to the user selected start point and performs the same set of table placements as described above. Similarly, the results of this second iteration may be stored on any suitable storage. Accordingly, the design automation computer system performs the above-described steps for each start point based upon the selected layout run type (e.g., Quick Run, Normal Run, and Detailed Run).

In each example, results of each iteration may be stored. During the layout process, the design automation computer system may allow a user to cancel or abort the layout process. In an example embodiment, canceling or aborting stops the first layout algorithm from proceeding and renders the last rendered (and completed) layout on the visual display.

If a user does not abort or cancel the layout run, the design automation computer system retrieves all stored layout results and determines a layout resulting in the highest KW for the site and renders that layout on the visual display.

The design automation computer system allows the user to continue performing a layout for all the regions on the site. The user may also undo the layout for a particular region which may clear the tables in the region. The user may also layout tables on a region already containing tables. Accordingly, the design automation computer system prompts the user to clear the tables previously placed and place the tables in the region based on the new set of input.

The user may also change the tables of an existing layout from one type of PV module (or table type) to another. Such a change may be referred to as a technology swap. Technology swaps may be applied in many examples including when procurement challenges make a specific set of modules from a module vendor unavailable. Accordingly a user may swap such unavailable modules for modules from a different module vendor. As long as the newer modules are similar in size and characteristics as the swapped out modules, the design automation computer system will facilitate such a technology swap.

As layouts are stored on suitable storage, the design automation computer system may efficiently re-render a pre-rendered layout. The design automation computer system may also allow a user to remove all stored layout result sets and restart the process. Further, a user may remove a specific set of layout result sets which may not be relevant. The design automation computer system also allows for exporting layout result sets into suitable output. In one example, such output may be in a human-readable tabular form to allow comparison using external tabular viewers.

The design automation computer system identifies a layout starting point on the region boundary. The layout starting point may be any suitable edge of the region boundary as previously defined. The design automation computer system simulates placing (or "tiling") PV blocks or tables in rows and columns based on the defined PV layout preferences. More specifically, the design automation computer system may apply PV tables or blocks in east-west rows and north-south columns. In most examples, the design automation computer system avoids any obstructions, or other impediments in applying the first layout algorithm. Layout is completed when the maximum system size is reached or when the layout region is covered with PV tables or blocks in a manner consistent with PV layout preferences. The completed layout may be stored for later comparison. The completed layout is further rendered as a three-dimensional site model by the design automation computer system.

As may be apparent, a variety of layouts may be generated depending on, for example, starting points, spacing between blocks and tables, and other variables. Depending upon the previously identified layout detail, the design automation computer system determines whether additional completed layouts are required and generates further layouts.

On generating all completed layouts, the design automation computer system may store the completed layouts as completed layout options. The design automation computer system sorts the completed layout options by either energy output or total system size. The design automation computer system facilitates a review of completed layout options by the user. Specifically, the design automation computer system presents an optimal (or preferred) layout to the user. The user may select the optimal layout or alternately review other options.

Alternatively, the selected PV system type is a parking canopy. In at least some examples, parking canopies use an alternative layout method. The design automation computer system receives the selection of the parking canopy system type. In most examples, parking canopies are laid out along a parking row axis. The design automation computer system receives graphical user input identifying parking row axes. The design automation computer system may determine canopy table spacing (determined based on, for example, logistical and maintenance reasons) and determine suitable table placement along the defined parking row axes. In at least some examples, the design automation computer system also receives orientation information for the canopies to allow the PV modules on the parking canopy to have greater exposure to solar irradiance. By collecting and determining these PV layout preferences, the design automation computer system determines the layout of blocks or tables in the parking canopy. However, in at least some examples, the design automation computer system may utilize an iterative process of table or block layout in parking canopies similar to the process described for ground mount and rooftop system types.

Upon determining the PV module layout, the design automation computer system further determines an integrated structural layout. The integrated structural layout defines system component and the placement and integration of any structural components needed to support the PV system. The design automation computer system retrieves the previously determined PV module layout and identifies sub-arrays within the PV module layout. Sub-arrays are defined as any grouping of PV modules that have spacing between modules exceeding the standard spacing.

The design automation computer system retrieves structural components associated with the PV module layout from the component library. A second layout algorithm is used to iterate through the PV module layout and place structural components. Structural components are placed factoring in rules and tolerances for modules and structures, received from the component library. Upon completion, the second layout algorithm generates an integrated PV structure/module layout ("PV structure layout"). The design automation computer system also determines an electrical design and an electrical layout. The design automation computer system receives a user selection indicating whether the PV system uses a central inverter.

The design automation computer system offers a broad-spectrum of electrical design tools extending from full automation to manual design, allowing the user a range of flexibility, speed and control. Several tools are used to group modules into electrical strings based on the string size identified by the user. Further, several equipment placement tools supplement such grouping tools. The design automation computer system may implement the use of such supplemental tools when the electrical configuration is determined (i.e., when the string-to-inverter configuration is determined.)

If the user selects a central inverter, the design automation computer system provides a selection of PV combiner options retrieved from the component library. The user may select a PV combiner from the PV combiner options. The design automation computer system determines a recommended quantity of strings per combiner based on the PV combiner box and the PV module.

Similarly, if the user selects a central inverter, the design automation computer system may provide a selection of PV re-combiner options retrieved from the component library. The user may select a PV re-combiner from the PV re-combiner options. The design automation computer system determines a recommended quantity of strings per re-combiner based on the PV combiner box and the PV module.

Whether the user selects a central inverter or not, the user selects a string size based on the recommendations of the string size calculator. The design automation computer system receives the string size selection and prompts the user for a target ratio of direct current to alternating current (DC/AC ratio). Accordingly, the user may reconfirm the string size previously identified during the creation of a table. The user may additionally select the number of strings per inverter (if a string inverter is selected) or the number of strings per combiner (if a central inverter is selected). The design automation computer system receives the DC/AC ratio and determines string-to-inverter possibilities. More specifically, the design automation computer system determines the number of strings in the PV module layout, and assigns each string to an inverter. Further, the design automation computer system repeats the string-to-inverter matching process for a variety of inverters. Because inverter types and sizes vary, many string-to-inverter possibilities may be generated. The string-to-inverter possibilities are sorted by either DC/AC ratio or by inverter quantity. The design automation computer system prompts the user for a selection of design configurations (i.e., a string-to-inverter configuration) and receives a design configuration selection.

String Grouping

In a first example, the design automation computer system allows a user to use a "Selection Order" tool. The design automation computer system may make Selection Order available when a user chooses the inverter (in the case of string inverters) or combiner (in the case of central inverters) desired to group modules into strings.

Initially, a user may activate the Selection Order tool and designate modules desired to be strung together in a particular order. The design automation computer system (and specifically, the Selection Order tool) renders the quantity of modules selected in a status bar as the user navigates along module rows. The design automation computer system allows the user to group the selected modules into one or more strings in a preferred order. The Selection Order tool accordingly allows a user to have control over the string grouping process by allowing the user to choose not only which modules are included, but the order in which they are included, and therefore, the direction of the string wiring as it connects all of the modules within the string.

In a second example, the design automation computer system allows a user to use a "Pre-Select" tool. The design automation computer system may make Pre-Select available when a user chooses the inverter (in the case of string inverters) or combiner (in the case of central inverters) desired to group modules into strings.

Initially, a user may select a group of modules and activate the Pre-select tool. The design automation computer system renders a quantity of modules in a status bar and the user may either add or remove modules from the selection set. The design automation computer system further allows the user to group the selected modules into one or more strings. The design automation computer system determines the order of the grouping and wiring using an algorithm that that connects modules while minimizing jumpers between module rows and columns. In an example embodiment, such an algorithm accordingly connects the modules in a "zig-zag" manner. The Pre-Select tool provides a faster implementation of string grouping.

In a third example, the design automation computer system allows a user to use a "Auto (Min Wiring)" tool. The design automation computer system may make Auto (Min Wiring) available when a user chooses the inverter (in the case of string inverters) or combiner (in the case of central inverters) desired to group modules into strings.

The design automation computer system allows a user to indicate the two directions in which the string grouping should commence (e.g., upwards and leftwards). The design automation computer system successively groups modules into strings based on the string size and the indicated two directions. The design automation computer system completes the process when all strings for the given inverter or combiner are filled or if a large gap is found in the layout.

In order to minimize jumper wiring, the algorithm stops and turns when a large gap between modules is encountered. Accordingly, in some examples, some of the modules within the layout may not be utilized for strings because they are beyond the threshold of allowable jumper wire length. In such examples, the design automation computer system allows such modules to be grouped into strings using Pre-select or Selection Order, or to remove them entirely from the layout.

In a fourth example, the design automation computer system allows a user to use a "Auto (Max KW)" tool. The design automation computer system may make Auto (Max KW) available when a user chooses the inverter (in the case of string inverters) or combiner (in the case of central inverters) desired to group modules into strings.

The design automation computer system allows a user using the Auto (Max KW) tool to selects a single module representing the starting point (e.g., a corner of the layout) of the modules that will be grouped into strings for a particular string inverter or combiner. The design automation computer system allows a user to indicate the two directions in which the string grouping commences. The design automation computer system groups modules successively into strings based on the string size and the indicated directions. The design automation computer system completes the process when all strings for the given inverter or combiner are filled. In contrast to Auto (Min Wiring), this algorithm allows for large gaps (and therefore long string jumper wires) in order to ensure that modules within the layout are grouped into a string. In that respect, this algorithm tends to maximize the system size (or KW) throughout the electrical design process.

In a fifth example, the design automation computer system allows a user to use a "Full Auto" tool. The Full Auto may be used with either of Min Wiring or Max KW. The Full Auto tool accordingly applies the above-described Auto tools (Min Wiring or Max KW) to the complete layout. Accordingly, while the previous algorithms only work for a single string inverter or combiner, the Full Auto tool processes throughout the full layout and returns a completely grouped string layout.

Electrical Equipment Placement

Similar to grouping, the design automation computer system may place electrical equipment manually or automatically. Once the grouping is completed (i.e. all strings are identified), the design automation computer system automatically places components dependent on the type of system (e.g., string inverters for string inverter systems, combiners and central inverters for central inverter systems). The design automation computer system places each type of component in a location that minimizes shade on the modules and minimizes the length of conductors feeding it. In each of the several cases (described below), the design automation computer system places components immediately for the entire site. After the design automation computer system makes such an automatic placement, the user may review and revise the placement as they see fit.

In a first case, the design automation computer system groups string inverters together in a single location on the site or in a distributed manner throughout the module layout depending on user preference. On smaller sites, the system designer might prefer to have all string inverters co-located and would choose a "Grouped" option and identify a location. On larger sites, a user may select the "Distributed" option causing each string inverter to be placed automatically at the centroid of the physical location of its respective strings. In either case, the design automation computer system allows the location of each string inverter to be manually adjusted by the user.

In a second case, central inverters may be automatically distributed throughout the array within "Inverter Enclosures" identified by the user. Accordingly, the design automation computer system allows the user to identify such inverter enclosures. Inverter enclosures may contain one or more inverters and may represent a concrete pad, pre-fabricated skid or pre-fabricated enclosure depending on the preference of the user. Regardless of the enclosure type, the design automation computer system makes the initial placement at the centroid of the physical location of all the strings feeding that inverter. The user may then adjust this location manually if needed.

In a third case, combiners may be automatically placed after central inverter placement. The design automation computer system offers the user an option to place the combiner at the centroid of the strings feeding it or offset from the centroid in the direction of its respective inverter. For the latter option, the combiner is still placed on one axis of the centroid of the string group but is shifted on the other axis such that the location is closer to the central inverter. In either case, the combiners may be moved or adjusted manually after automatic placement.

Wire Schedule

As soon as a complete circuit is made from modules to inverter, the DC (direct current) wire schedule tool is activated in the design automation computer system. The DC wire schedule tool provides a list of applicable wires and their lengths. Therefore, the information in the list may be used to connect strings to combiners/string inverters and from combiners to central inverters. In some respects, the DC wire schedule is similar to the Bill of Materials (described below) but focused on determining the wire type and size based on estimated length, the equipment connected and applicable code/environmental factors. As long as there is a string identified and/or grouped, and the associated string inverter (or, alternately combiner or central inverter) is placed in the model, the design automation computer system provides a DC wire schedule populated with information. In the display of the DC wire schedule, each conductor segment of the circuit is broken out in the wire schedule. In one example, the distances are estimated using the distance calculated based on component sums (using x-y components) between each end of the conductor. The design automation computer system updates the wire schedule (or DC wire schedule) based on any adjustments made to the location of components or properties of components.

The DC wire schedule tool receives each conductor segment and uses its properties and the user settings to define several attributes of the electrical system. In the example embodiment, the DC wire schedule tool (and, therefore, the design automation computer system) defines the required current carrying conductor size, grounding conductor and conduit/raceway.

The required current carrying conductor size is determined in part based on conductor segment properties received by the design automation computer system. Conductor segment properties include short circuit current, ambient temperature, quantity of conductors in the given raceway (conduit), conductor material (e.g., aluminum or copper), conductor resistance, and length of the segment.

The design automation computer system (via the DC wire schedule tool) determines the current carrying conductor (CCC) size based on the conductor segment properties described above. Generally, the CCC size refers to the minimum conductor size allowable by code. Several de-rate factors may be applied to determine the minimum conductor size and the number of parallel conductors required to support the current of the circuit when more than one conductor is required. Such de-rate factors may include temperature, conduit fill, and the like. The de-rate factors may be retrieved from a database associated with the design automation computer system or received by a user based on a prompt.

After the minimum CCC is found, user settings are applied to further refine the minimum conductor selection. In one example, a user may define a minimum conductor size greater than the minimum required, in which case the conductor size in the wire schedule will be increased to the user-defined minimum. In a second example, a user may define a maximum voltage drop that results in the minimum CCC size becoming out of compliance with voltage drop standards defined by the user. When the maximum voltage drop is exceeded, the design automation computer system upsizes the conductor until the voltage drop on the circuit (as determined by the conductor length and wire resistance) is below the maximum voltage drop.

Once the CCC is set, the DC wire schedule determines the minimum allowable grounding conductor size based on code.

Once both the CCC and grounding conductor are defined, the DC wire schedule algorithm determines the minimum allowable conduit or raceway size based on the previous determinations, applicable electrical code and user-defined settings. For example, such settings may include conduit type and a designation of whether or not a raceway is used in the conductor segment.

Once a wire schedule is generated, the design automation computer system allows a user to alter, individually for each circuit, the size, type or quantity of CCCs, grounding conductor size, or conduit size. At each point of alteration, the design automation computer system executes code checks and user threshold checks (e.g., verifying that maximum voltage drop is not exceeded) to ensure compliance of the system. If the design automation computer system determines that a user choice causes a conductor to be out of compliance, an error flag is generated that shows entries on the wire schedule table that are out of compliance.

The design automation computer system also allows a user to export the DC wire schedule at any time to an Excel-ready CSV file.

Conduit Routing

The design automation computer system also includes a conduit routing tool. The conduit routing tool may be used for conduits, wire trays, and any type of wire management or raceway system. The conduit routing tool may also be applied to direct-buried cables. The conduit routing tool allows the design automation computer system (automatically or via user input) to draw a path that conductors physically take within the system layout. The conduit routing tool is also used to inform the DC wire schedule. For example, when a conductor route is complete, the DC wire schedule tool receives the length of the route determined by the conduit routing tool (rather than the estimated x-y component length) to compute values including the minimum CCC size. In one example, the conduit routing tool determines the conduit route based on user input. For example, a user may select the significant corners of the route (e.g., essentially drawing connecting lines) between a child (e.g., string or combiner) and a parent (e.g., string inverter, combiner, or central inverter). If the user draws a route between a child and parent that already has a route extending to it, the user may alternately select the existing route to have it act as a guide, such that the new route is cleanly drawn in parallel with the existing route. The automatic parallel routing may allow for more efficient design. Each new route refreshes the wire schedule and enables the user to judge the impact of routing conductors a certain way throughout the layout.

The design automation computer system places components within the PV structure layout and the PV module layout. As used herein, the structural layout, the electrical design, the electrical layout, the PV module layout, and the bill of materials may all be referred to as creating a general system layout or a "PV system model." The PV system model substantially defines a representation of the designed PV system. In one example, the placement of components is done manually and incorporates supplemental user input. In the example embodiment, the placement of components is automated. Based on the placed components and the selected design configuration, the design automation computer system automatically generates a wire schedule. Because component placements, component properties, system hierarchies, and electrical code are all known, the design automation computer system requires no additional input to generate the wire schedule. In some examples, the design automation computer system may receive specific physical paths for conductors designated by the user. Based on such input, the wire schedule may be altered or regenerated. Upon determination of the wire schedule, the design automation computer system may finalize the electrical design and electrical layout.

The design automation computer system additionally may determine a list of components, materials, sub-assemblies, intermediate assemblies, sub-components, parts and the quantities to construct the PV system. This list may be referred to as the bill of materials. The design automation computer system receives the previously determined structural layout, electrical layout, and PV module layout and generates an integrated model. The design automation computer system automatically identifies all components within the integrated model. The design automation computer system also retrieves the wire schedule and calculates the total of all electrical components included in the wire schedule. The design automation computer system additionally retrieves information regarding each component from the component library. In some examples, the design automation computer system also receives labor man-hours and cost data regarding installation and service costs for the area of the PV system from a labor cost database. The design automation computer system additionally receives material cost data for the components and electrical components from a material cost database. The design automation computer system accordingly calculates the cost of all system components in the integrated model including material and labor costs. As described above and herein, when changes are made to the system design (e.g., changes made to the electrical design that result in new DC wire schedules or new conduit routing), the bill of materials may also be updated by the design automation computer system to incorporate such changes.

The design automation computer system also defines an energy production model. The design automation computer system receives energy production parameter definitions based on weather data and simulation specifications. The energy production parameter definitions may accordingly incorporate local design data. The design automation computer system additionally receives the integrated layout and determines an estimated energy production and yield. The estimated energy production and yield is used to determine an overall energy model.

The design automation computer system may further receive energy pricing data and determine a financial model.

By incorporating the bill of materials and cost information, and the overall energy model, the financial model may include a cost estimation and a profitability analysis.

A technical effect of the systems and methods described herein include at least one of (a) enhanced quality of PV systems by identifying preferable PV system layouts through advanced simulation; (b) increased efficiency in the design of PV systems; (c) reduced risk of structural damage to PV systems through simulations and use of local design data; and (d) improved profitability of the final system through optimization of the PV system design.

More specifically, such technical effects can be achieved by performing at least one of the following steps: (a) receiving a set of site data, wherein the site data includes a set of location identifiers; (b) receiving a system type selection; (c) receiving a plurality of system component selections; (d) receiving a plurality of PV layout preferences; (e) determining, at the design automation computer system, a PV module layout by iteratively applying a first layout algorithm to the set of site data and the plurality of PV layout preferences, the PV module layout defining a placement of a plurality of PV modules of a PV system; (f) determining a structural layout, an electrical design, and an electrical layout based on the PV module layout; (g) determining a bill of materials based on the PV module layout, the structural layout, and the electrical layout; (h) defining a PV model using the structural layout, the electrical design, the electrical layout, the PV module layout, and the bill of materials; (i) determining a set of location design characteristics based on the set of site data; (j) retrieving a set of structural product rules; (k) identifying a subset of structural product rules associated with the set of location design characteristics; (l) refining the structural layout based on the subset of structural product rules; (m) receiving a set of boundary offsets associated with the set of site data; (n) receiving a set of obstruction definitions associated with the set of site data, the set of obstruction definitions including a set of obstruction heights and a set of obstruction offsets; (o) determining a set of shadow setbacks based on the set of obstruction definitions; (p) determining the PV module layout based on the set of shadow setbacks such that the shadow setbacks define a plurality of regions where the plurality of PV modules cannot be placed; (q) identifying a set of obstructions based on the set of obstruction definitions; (r) projecting a set of shadows for a plurality of time periods based on the set of obstructions and a projected sun location for each of the plurality of time periods; (s) integrating the set of shadows into an integrated shadow setback area; (t) providing a plurality of first component options to a user device based on a component library, receiving a first component selection corresponding to one of the plurality of first component options, from the user device, retrieving, from the component library, a plurality of second component options associated with the first component selection, providing the plurality of second component options to the user device, and receiving a second component selection corresponding to one of the plurality of second component options, from the user device; (u) receiving one of a parking canopy type selection, a ground mount type selection, and a rooftop type selection; (v) providing the plurality of system component selections based on the system type selection; (w) receiving the plurality of PV layout preferences based on the system type selection; and (x) determining an energy simulation, a cost estimation, and a profitability analysis based on the structural layout, the electrical design, the electrical layout, the PV module layout, and the bill of materials.

Figure 2:
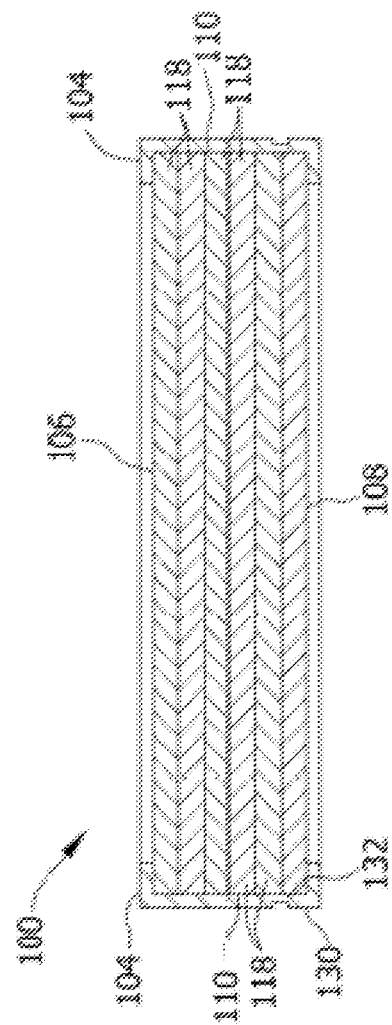
FIG. 2 is a cross-sectional view of the PV module shown in FIG. 1 taken along the line A-A.

Referring initially to FIGS. 1 and 2, a PV module is indicated generally at 100. A perspective view of the PV module 100 is shown in FIG. 1. FIG. 2 is a cross sectional view of the PV module 100 taken at line A-A shown in FIG. 1. The PV module 100 includes a solar laminate 102 (also referred to as a PV laminate) and a frame 104 circumscribing the solar laminate 102.

The solar laminate 102 includes a top surface 106 and a bottom surface 108 (shown in FIG. 2). Edges 110 extend between the top surface 106 and the bottom surface 108. In this embodiment, the solar laminate 102 is rectangular shaped. In other embodiments, the solar laminate 102 may have any suitable shape.

As shown in FIG. 2, the solar laminate 102 has a laminate structure that includes several layers 118. Layers 118 may include for example glass layers, non-reflective layers, electrical connection layers, n-type silicon layers, p-type silicon layers, and/or backing layers. In other embodiments, solar laminate 102 may have more or fewer layers 118, including only one layer, or may have different layers 118, and/or may have different types of layers 118. The solar laminate 102 includes a plurality of solar cells (not shown), each of which converts solar energy to electrical energy. The outputs of the solar cells are connected in series and/or parallel to produce the desired output voltage and current for the solar laminate 102.

As shown in FIG. 1, the frame 104 circumscribes the solar laminate 102. The frame 104 is coupled to the solar laminate 102, as best seen in FIG. 2. The frame 104 assists in protecting the edges 110 of the solar laminate 102. In this embodiment, the frame 104 is constructed of four frame members 120. In other embodiments the frame 104 may include more or fewer frame members 120.

This frame 104 includes an outer surface 130 spaced apart from solar laminate 102 and an inner surface 132 adjacent solar laminate 102. The outer surface 130 is spaced apart from and substantially parallel to the inner surface 132. In this embodiment, the frame 104 is made of aluminum. More particularly, in some embodiments the frame 104 is made of 6000 series anodized aluminum. In other embodiments, the frame 104 may be made of any other suitable material providing sufficient rigidity including, for example, rolled or stamped stainless steel, plastic, or carbon fiber.

Figure 3:
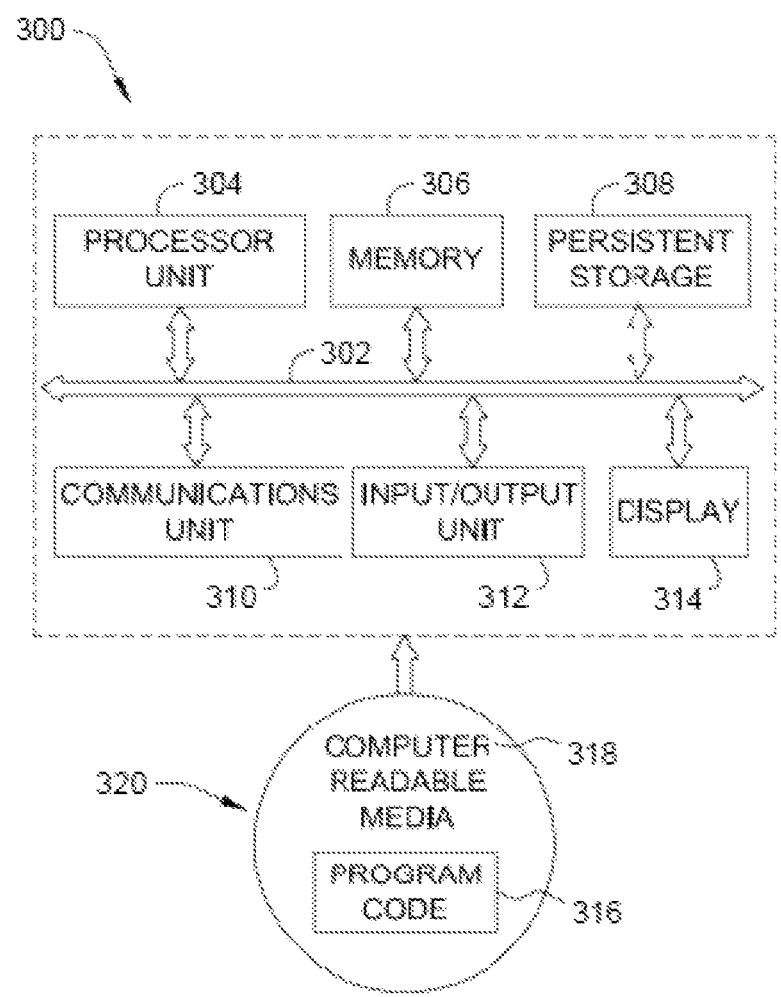
FIG. 3 is a block diagram of an example computing device.

Some example methods and systems are performed using and/or include computing devices. FIG. 3 is a block diagram of an example computer system 300, specifically design automation computer system 300. More specifically, design automation computer system 300 represents an example embodiment of a design automation computer system. In the example implementation, design automation computer system 300 includes communications fabric 302 that provides communications between a processor unit 304, a memory 306, persistent storage 308, a communications unit 310, an input/output (I/O) unit 312, and a presentation interface, such as a display 314. In addition to, or in alternative to, the presentation interface may include an audio device (not shown) and/or any device capable of conveying information to a user.

Processor unit 304 executes instructions for software that may be loaded into a storage device (e.g., memory 306). Processor unit 304 may be a set of one or more processors or may include multiple processor cores, depending on the particular implementation. Further, processor unit 304 may be implemented using one or more heterogeneous processor systems in which a main processor is present with secondary processors on a single chip. In another implementation, processor unit 304 may be a homogeneous processor system containing multiple processors of the same type.

Memory 306 and persistent storage 308 are examples of storage devices. As used herein, a storage device is any tangible piece of hardware that is capable of storing information either on a temporary basis and/or a permanent basis. Memory 306 may be, for example, without limitation, random access memory (RAM) such as dynamic RAM (DRAM) or static RAM (SRAM), read-only memory (ROM), erasable programmable read-only memory (EPROM), electrically erasable programmable read-only memory (EEPROM), non-volatile RAM (NVRAM), and/or any other suitable volatile or non-volatile storage device. Persistent storage 308 may take various forms depending on the particular implementation, and persistent storage 308 may contain one or more components or devices. For example, persistent storage 308 may be one or more hard drives, flash memory, rewritable optical disks, rewritable magnetic tapes, and/or some combination of the above. The media used by persistent storage 308 also may be removable. For example, without limitation, a removable hard drive may be used for persistent storage 308.

A storage device, such as memory 306 and/or persistent storage 308, may be configured to store data for use with the processes described herein. For example, a storage device may store (e.g., have embodied thereon) computer-executable instructions, executable software components, system component data, PV system layouts, installation instructions, work orders, and/or any other information suitable for use with the methods described herein. When executed by a processor (e.g., processor unit 304), such computer-executable instructions and/or components cause the processor to perform one or more of the operations described herein.

Communications unit 310, in these examples, provides for communications with other computing devices or systems. In the example implementation, communications unit 310 is a network interface card. Communications unit 310 may provide communications through the use of either or both physical and wireless communication links. Communication unit 310 provides communication to one or more element of the PV system.

Input/output unit 312 enables input and output of data with other devices that may be connected to design automation computer system 300. For example, without limitation, input/output unit 312 may provide a connection for user input through a user input device, such as a keyboard and/or a mouse. Further, input/output unit 312 may send output to a printer. Display 314 provides a mechanism to display information, such as any information described herein, to a user. For example, a presentation interface such as display 314 may display a graphical user interface, such as those described herein. The communication device 310 may include one or more analog I/O.

Instructions for the operating system and applications or programs are located on persistent storage 308. These instructions may be loaded into memory 306 for execution by processor unit 304. The processes of the different implementations may be performed by processor unit 304 using computer implemented instructions and/or computer-executable instructions, which may be located in a memory, such as memory 306. These instructions are referred to herein as program code (e.g., object code and/or source code) that may be read and executed by a processor in processor unit 304. The program code in the different implementations may be embodied in a non-transitory form on different physical or tangible computer-readable media, such as memory 306 or persistent storage 308.

Program code 316 is located in a functional form on non-transitory computer-readable media 318 that is selectively removable and may be loaded onto or transferred to design automation computer system 300 for execution by processor unit 304. Program code 316 and computer-readable media 318 form computer program product 320 in these examples. In one example, computer-readable media 318 may be in a tangible form, such as, for example, an optical or magnetic disc that is inserted or placed into a drive or other device that is part of persistent storage 308 for transfer onto a storage device, such as a hard drive that is part of persistent storage 308. In a tangible form, computer-readable media 318 also may take the form of a persistent storage, such as a hard drive, a thumb drive, or a flash memory that is connected to design automation computer system 300. The tangible form of computer-readable media 318 is also referred to as computer recordable storage media. In some instances, computer-readable media 318 may not be removable.

Alternatively, program code 316 may be transferred to design automation computer system 300 from computer-readable media 318 through a communications link to communications unit 310 and/or through a connection to input/output unit 312. The communications link and/or the connection may be physical or wireless in the illustrative examples. The computer-readable media also may take the form of non-tangible media, such as communications links or wireless transmissions containing the program code.

In some illustrative implementations, program code 316 may be downloaded over a network to persistent storage 308 from another computing device or computer system for use within design automation computer system 300. For instance, program code stored in a computer-readable storage medium in a server computing device may be downloaded over a network from the server to design automation computer system 300. The computing device providing program code 316 may be a server computer, a workstation, a client computer, or some other device capable of storing and transmitting program code 316.

Program code 316 may be organized into computer-executable components that are functionally related. Each component may include computer-executable instructions that, when executed by processor unit 304, cause processor unit 304 to perform one or more of the operations described herein.

The different components illustrated herein for design automation computer system 300 are not meant to provide architectural limitations to the manner in which different implementations may be implemented. The different illustrative implementations may be implemented in a computer system including components in addition to or in place of those illustrated for design automation computer system 300. For example, in some embodiments, computing device includes a global positioning system (GPS) receiver. Moreover, components shown in FIG. 3 can be varied from the illustrative examples shown. As one example, a storage device in design automation computer system 300 is any hardware apparatus that may store data. Memory 306, persistent storage 308 and computer-readable media 318 are examples of storage devices in a tangible form.

In another example, a bus system may be used to implement communications fabric 302 and may include one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, without limitation, memory 306 or a cache such as that found in an interface and memory controller hub that may be present in communications fabric 302.

Figure 4:
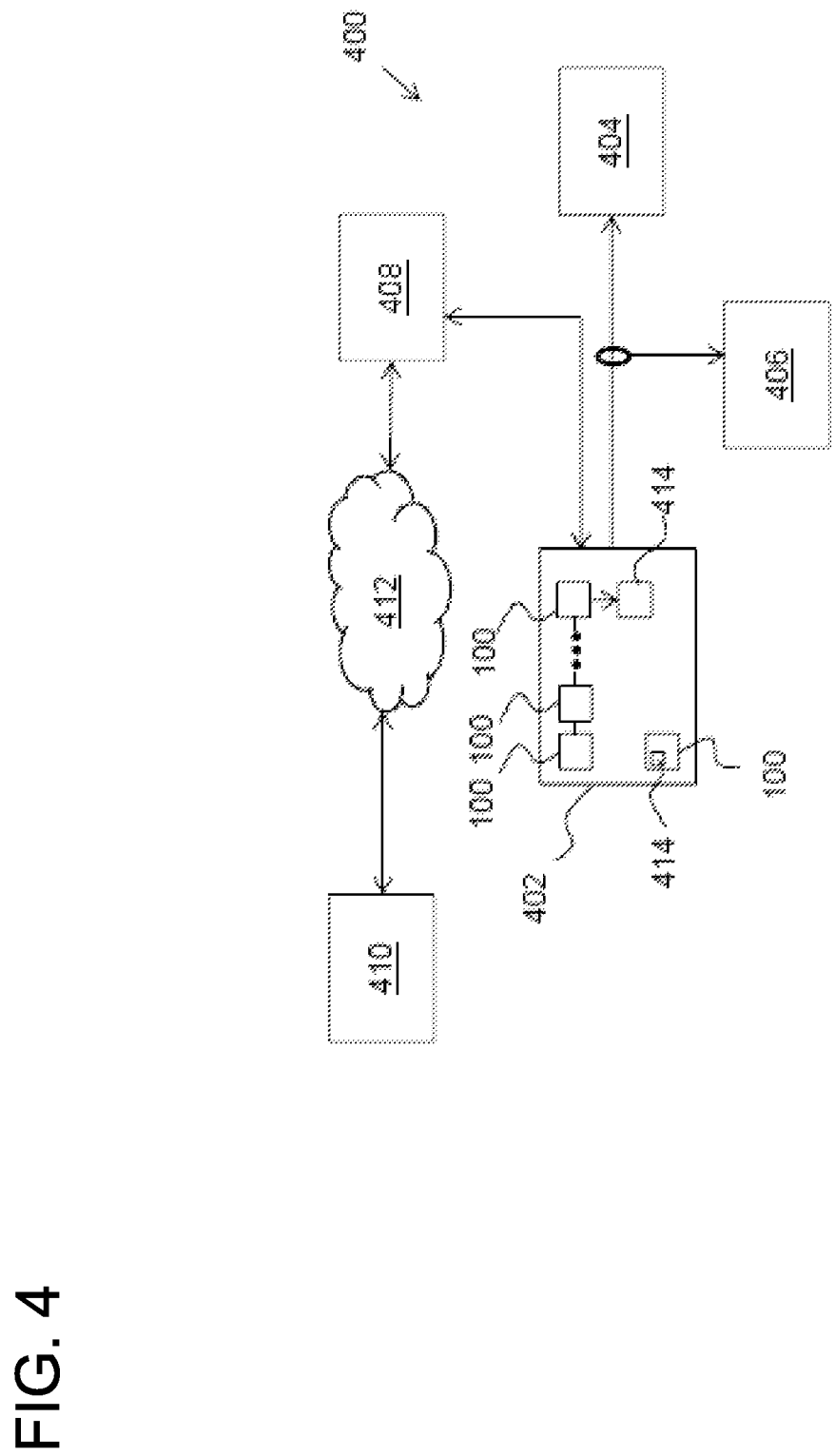
FIG. 4 is a block diagram of an example PV system.

FIG. 4 is a block diagram of an example PV system 400. The PV system 400 includes an array 402 of PV modules 100 and one or more inverters. The array 402 outputs AC power to one or more loads 404. A meter 406 measures the power delivered to the loads 404. A gateway device 408, also referred to as a data acquisition device, a data logger, or a data acquisition system (DAS), monitors the array 402 and transmits data collected from the array 402 to a backend system 410 via a network 412. Backend system 410 includes one or more design automation computer system 300. Backend system 410 is usually located at a second location physically separated from the first location at which PV system 400 is located. Alternatively, the second system may be located at the same site as the PV system 400. Moreover, the gateway device 408 may provide information to and communicate with more than one backend systems 410. The distance between the first location and the second location will vary among installed PV systems 400. In some embodiments, the first location and the second location are greater than five miles apart. In other embodiments, the first and second locations are more than ten miles apart, 25 miles apart, 50 miles apart, 100 miles apart, 200 miles apart, or even located on different continents.

The array 402 may be any suitable array of PV modules 100 and one or more inverters 414. For example, the array 402 may include a plurality of PV modules arranged in strings of PV modules. Each string of modules is connected to a single inverter to convert the DC output of the string of PV modules to an AC output. Alternatively, or additionally, each PV module may be coupled to its own inverter 414 (sometimes referred to as a microinverter) positioned near or on the PV module to which it is electrically coupled. In still other examples, a plurality of strings of PV modules may be connected, directly or through one or more string combiners, to a single inverter 414, sometimes referred to as a central or string inverter.

In embodiments that do not include microinverters, the array 402 may include a direct current power manager (DCPM) coupled to each PV module. The DCPM performs, for example, maximum power point tracking (MPPT) for the PV module. It may also selectively control (i.e., limit and/or increase) the maximum power output of the PV module and/or control the conduction of bypass diodes based on temperature and bypass current. The DCPM may also translates the output I-V curve of the PV module to a new I-V curve at which the output voltage does not vary with ambient temperature.

In some embodiments, the array 402 includes one or more tracking devices configured to selectively position the PV modules relative to the sun to attempt to maximize the solar energy incident on the PV modules over time. Any other suitable arrangement of PV modules and inverter(s) may be used, including combinations of the arrangements described above.

The gateway device 408 collects data concerning array 402, such as via one or more sensors (not shown). The gateway device 408 is and/or includes a computing device, such as design automation computer system 300. The collected data may include any appropriate operational, situational, environmental, or other data related to the operation and/or condition of the array 402. For example, the gateway may monitor the ambient air temperature around the array 402, the amount of sunlight incident on the array 402 (or one or more PV modules), the output voltage and current of the array 402, the output voltage and current of each PV module, the output voltage and current of each inverter and/or microinverter 414, the surface temperature of the PV modules 100, etc. Moreover, in some embodiments, the gateway device 408 is in communication with one or more components of the array 402. For example, the gateway device 408 may be in communication with one or more inverters 414 in the array 402. Each inverter 414 may provide the gateway device 408 with, for example, its input voltage, its input current, its output voltage, its output current, etc. In some embodiments, the array 402 (and more particularly the inverters 414) may be controlled via the gateway device 408.

In one example, the network 412 is the Internet. In other implementations, network 412 is any other suitable communication network, including, for example, a wide area network (WAN), a local area network (LAN), a cellular network, etc. Network 412 may include more than one network. For example, gateway device 408 may connect to the Internet through one or more other networks and/or interfaces, such as a local area network (LAN), a wide area network (WAN), a home area network (HAN), dial-in-connections, cable modems, and high-speed ISDN lines.

Figure 5:
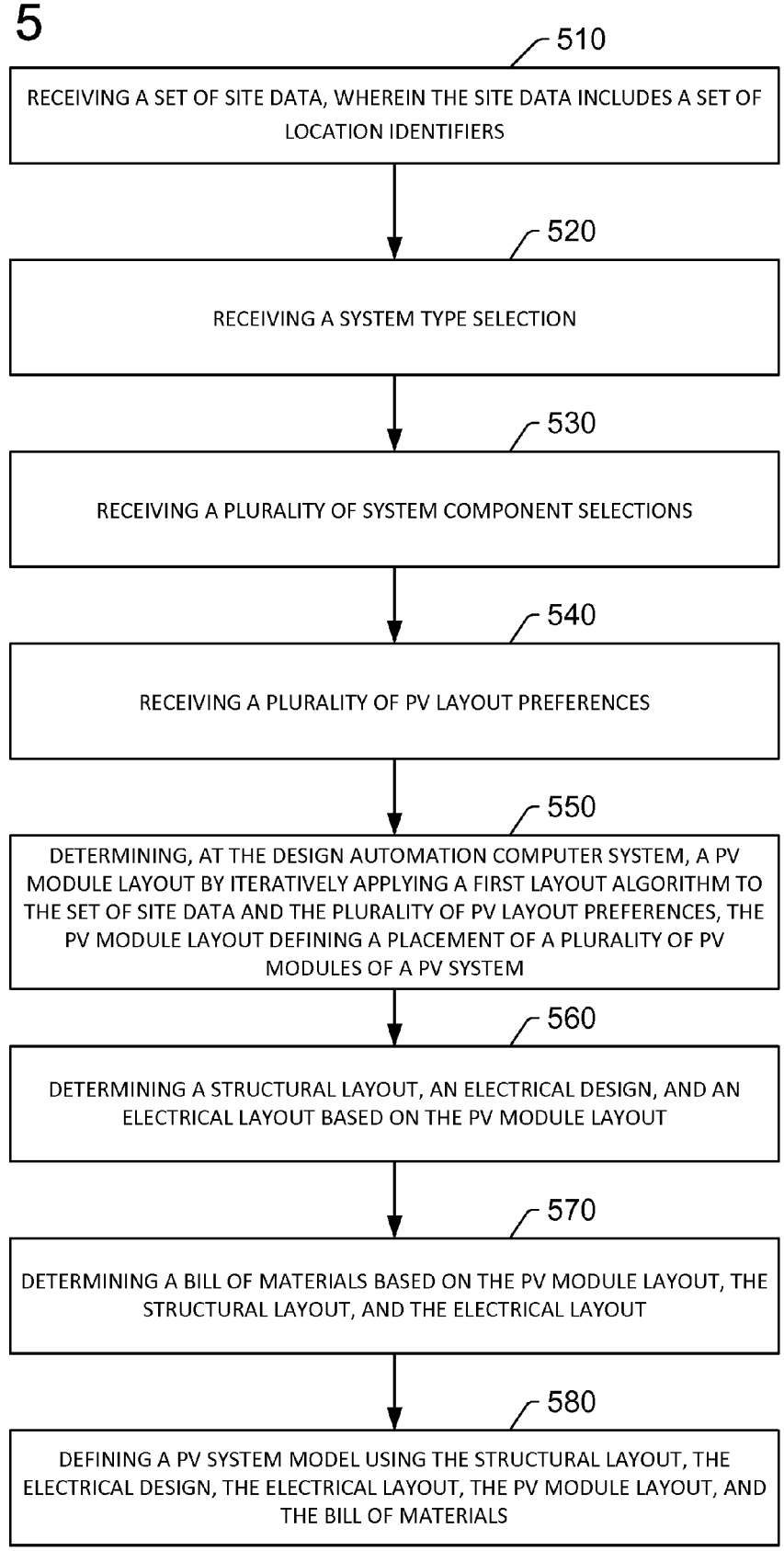
FIG. 5 is a flow diagram of an example method of designing a photovoltaic (PV) system implemented by the design automation computer system of FIG. 3.

FIG. 5 is a flow diagram of an example method of designing a photovoltaic (PV) system as shown in FIG. 4, implemented by the design automation computer system 300 (shown in FIG. 3). Design automation computer system 300 is configured to receive 510 a set of site data, wherein the site data includes a set of location identifiers.

Design automation computer system 300 is also configured to receive 520 a system type selection. Design automation computer system 300 is further configured to receive 530 a plurality of system component selections.

Design automation computer system 300 is additionally configured to receive 540 a plurality of PV layout preferences. Design automation computer system 300 is also configured to determine 550 a PV module layout by iteratively applying a first layout algorithm to the set of site data and the plurality of PV layout preferences, the PV module layout defining a placement of a plurality of PV modules of a PV system.

Design automation computer system 300 is additionally configured to determine 560 a structural layout, an electrical design, and an electrical layout based on the PV module layout. Design automation computer system 300 is further configured to determine 570 a bill of materials based on the PV module layout, the structural layout, and the electrical layout. Design automation computer system 300 is additionally configured to define 580 a PV system model using the structural layout, the electrical design, the electrical layout, the PV module layout, and the bill of materials.

FIGS. 6-17 are detailed flow diagrams illustrating steps performed by design automation computer system 300 (shown in FIG. 3) to design a PV system.

Figure 6:
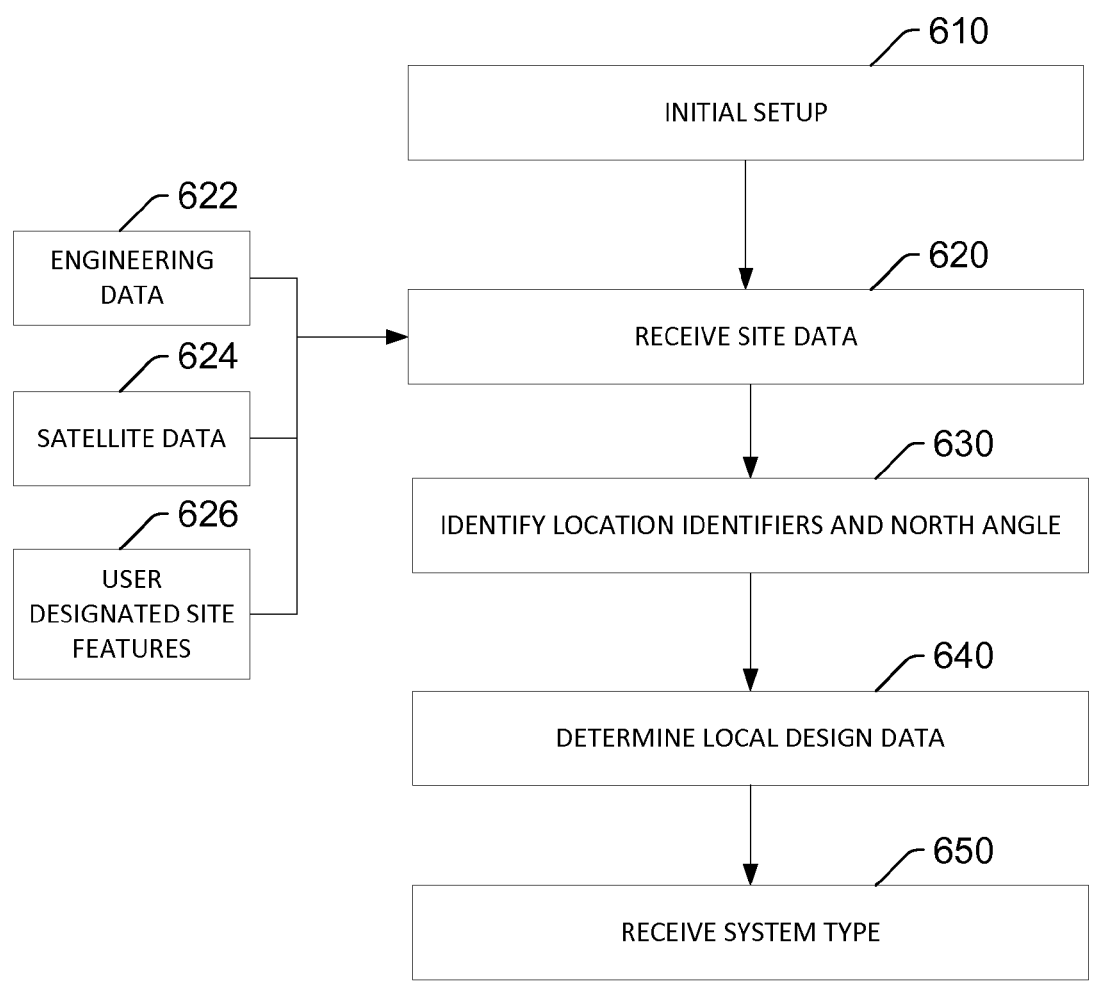
FIGS. 6-19 are detailed flow diagrams illustrating steps performed by the design automation computer system of FIG. 3 to design a PV system.

Referring to FIG. 6, at initial setup 610, design automation computer system 300 receives a set of site data 620. Set of site data 620 represents a depiction of a geographic site considered as a location for the PV system. Set of site data 620 may include drawings or renderings of the geographic site. In one example, set of site data 620 includes satellite data 624 such as satellite images and terrain images. In a second example, set of site data 620 includes computer-aided design ("CAD") drawings or engineering data 622 indicating the features of the geographic site. In a third example, set of site data 620 may represent location identifiers including, for example, geographic coordinates such as latitude and longitude coordinates. In such examples, design automation computer system 300 may retrieve further data such as satellite images and terrain data by accessing an external system containing geospatial data.

Design automation computer system 300 may also receive additional site features 626 that are not included in set of site data 620. For example, the geographic site may include a tree that is not visible or indicated in set of site data 620. As the tree may be an obstruction relevant to the design of the PV system, the user may identify the obstruction and provide it to design automation computer system 300.

Design automation computer system 300 also receives a set of location identifiers and a north angle 630. The set of location identifiers substantially identify the physical location associated with first set of site data 620. In at least some examples, the set of location identifiers are provided explicitly from a user device. In other examples, the set of location identifiers is derived from the set of site data using any suitable method including, for example, image analysis and metadata analysis.

Design automation computer system 300 also identifies a north angle for the set of site data. In some examples, the north angle may be automatically determined based on the set of location identifiers. In other examples, the north angle may be provided explicitly from a user device.

Design automation computer system 300 determines local design data 640 based on set of site data 620. Local design data 640 may be retrieved from a local database, an external system, or a plurality of external systems. Local design data 640 may include, for example and without limitation, seismic load data, wind load data, snow load data, solar data, wetland area identification data, floodplain area identification data, soil data, and elevation data. Some examples of external systems that may be used to retrieve local design data 640 include engineering society databases, government databases, and academic databases. In at least one example, design automation computer system 300 utilizes application program interfaces ("APIs") to access local design data 640 from such external resources. In a further example, design automation computer system 300 aggregates local design data 640 from a plurality of sources and stores such aggregated local design data 640 at an associated local design database. Local design data 640 may be beneficial in the design of PV systems, as described herein, to identify local variables and risks associated with the location of set of site data 620. For example, a first location may be associated with high winds. When designing a parking canopy system in the first location, such high winds may shear PV modules from the canopy. Accordingly, structural components may be utilized to mitigate the risk of high winds. In a second example, a second location may be associated with regular flooding. When designing a ground mount system in the second location, structural components may be utilized to mitigate the risk of flooding.

Design automation computer system 300 also receives a system type selection 650. More specifically, a user accessing design automation computer system 300 selects a type of PV system. In the example embodiment, the system type selection may be ground mount, rooftop, and parking canopy. In other examples, other system types may be selected and configured in manners consistent with those described herein.

In at least some examples, design automation computer system 300 also receives layout region identifications and designations. More specifically, a user may identify a portion of the geographic site associated with set of site data 620 for use with the designed PV system. In one example, the user may graphically identify a subsection of the geographic site that may be used. In further examples, the user may provide a name for the subsection. The user may design multiple PV systems in the same geographic site. Therefore, identifiers may be useful to distinguish each subsection associated with a distinct PV system.

Figure 7:
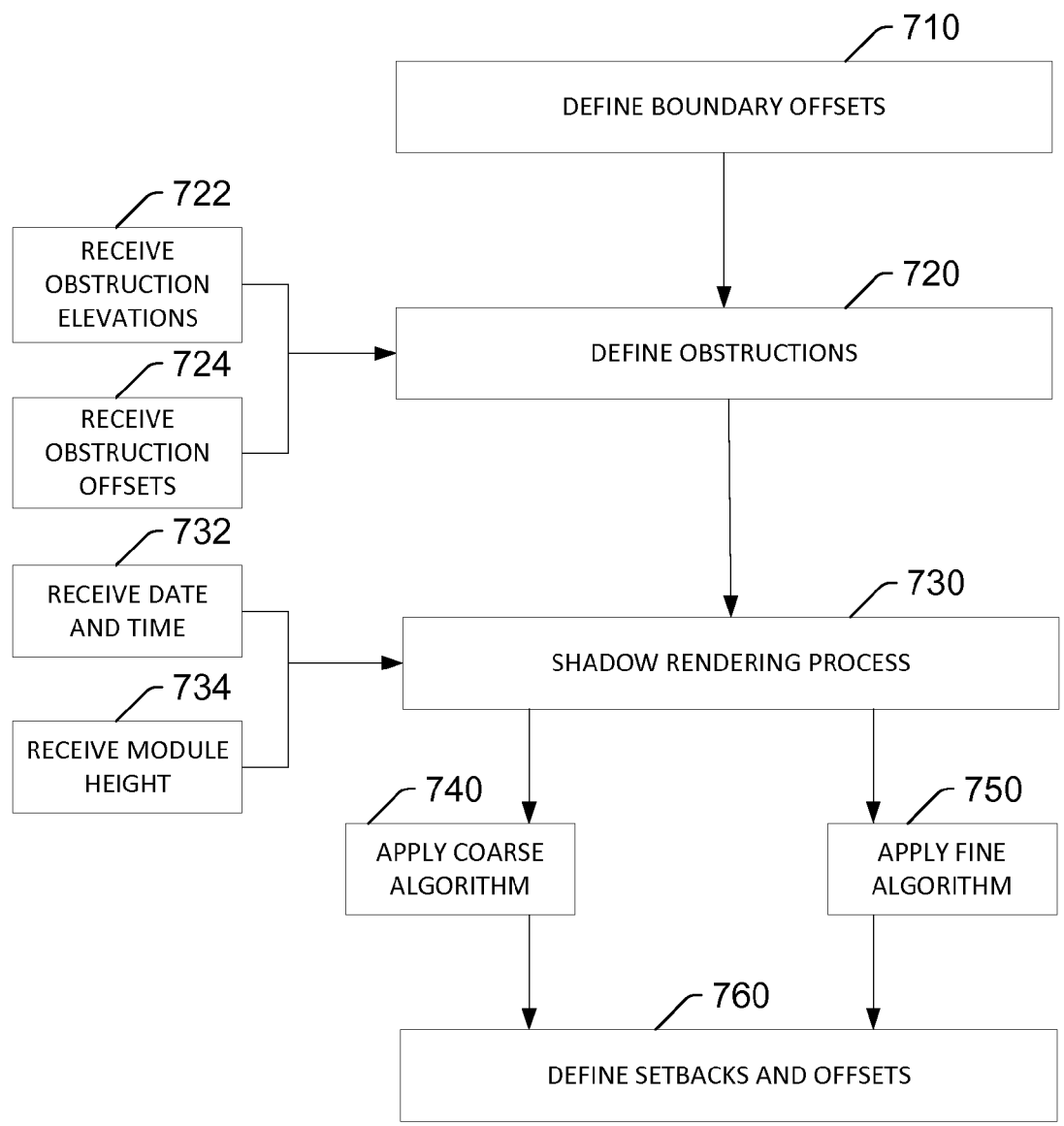

Referring to FIG. 7, design automation computer system 300 may also define boundary offsets 710 associated with set of site data 620. Defined boundary offsets 710 identify areas which cannot be utilized in the layout of the PV system. Such boundary offsets 710 may be chosen for logistical purposes (e.g., to allow maintenance crews to access the PV system easily) or any other reason. In one example, a rooftop system is selected and defined boundary offsets 710 allow a walking path around the PV system for maintenance access. Defined boundary offsets 710 may be identified graphically.

Design automation computer system 300 additionally may define obstructions 720 associated with set of site data 620. Obstruction definitions 720 define any obstructions that are located at the geographic site. Examples of obstruction definitions 720 may include obstruction locations, obstruction heights 722, and obstruction offsets 724. Obstruction locations and obstruction heights 722 may be provided explicitly. Alternately, obstruction locations and obstruction heights 722 may be determined by processing the set of site data using, for example, image analysis. In at least some examples, design automation computer system 300 may identify obstructions and obstruction heights 722 without user input. Obstruction offsets 724 reflect offsets associated with the obstruction. In at least some examples, obstruction offsets 724 are determined because of maintenance requirements. In the example embodiment, obstruction offsets 724 are provided by a user at a user device.

Using the set of obstruction definitions 720, design automation computer system 300 determines a set of shadow setbacks. More specifically, design automation computer system 300 identifies the set of obstructions 720 based on the set of obstruction definitions and uses a shadow rendering process 730 to project shadow effects on the geographic site for a plurality of time periods. Design automation computer system 300 identifies simulation time periods and identifies a projected sun location for each time period. Using the projected sun location, design automation computer system 300 projects the shadow effects of the sun and the set of obstructions on the geographic site. In at least some examples, the user provides the time periods 732 (e.g., dates and times) for simulating such shadow effects. In further examples, multiple PV module heights 734 may be simulated to show varying shadow effects based on the height of the PV modules. In such examples, the user may provide potential PV module heights 734.

In the example embodiment, design automation computer system 300 uses two algorithms to render shadow effects. In a first example, a coarse algorithm 740 is used. Coarse algorithm 740 identifies obstructions based on the set of obstruction definitions 720 and projects the shadow caused by each obstruction based on the projected sun position vector for each period in the simulated time period. In the second example, a fine algorithm 750 is applied to refine the output of coarse algorithm 740. Fine algorithm 750 performs sun position ray tests at short distance increments (e.g., less than 6 inches) in order to create higher resolution shadow effects. Fine algorithm 750 therefore produces a more precise shadow effects through this detailed simulation.

Shadow effects represent areas where PV systems will not yield optimal energy production (because of the temporary or total reduction in solar irradiance at the location). Accordingly, it may be undesirable to place PV modules where obstructions cause shadow effects. Design automation computer system 300 therefore integrates the set of shadow effect areas into an integrated shadow setback area or a defined setback and offset 760. Defined setback and offset 760 is used as negative space to define where the PV system should not be designed.

Figure 8:
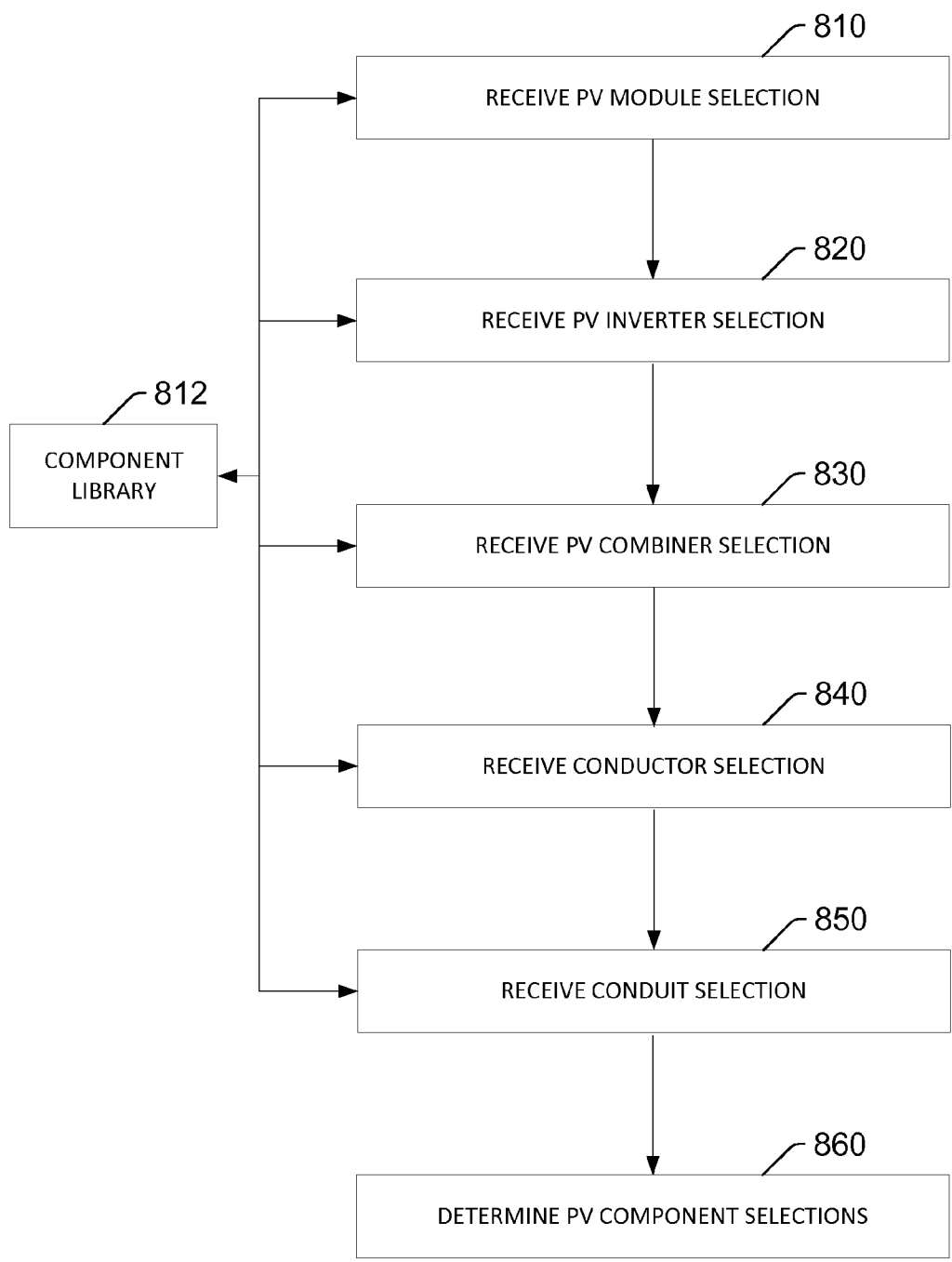

Referring to FIG. 8, design automation computer system 300 also receives a plurality of system component selections 810, 820, 830, 840, and 850. System component selections 810, 820, 830, 840, and 850 represent the selections of equipment that will be used by the PV system for energy production and transfer. Accordingly, in most examples, system components 810, 820, 830, 840, and 850 include PV modules 810, PV inverters 820, PV combiners 830, conductors 840, and conduits 850. In the example embodiment, design automation computer system 300 identifies potential system component selections from a component library 812. As used herein, "component library" 812 refers to a data store that catalogues components used in PV system design. Component library 812 includes definitions and identifiers for system components 810, 820, 830, 840, and 850, structural components, and electrical components. Further, component library 812 identifies which components may be used with other components. (In at least some examples, some system components 810, 820, 830, 840, and 850 may only be used with a subset of other available system components 810, 820, 830, 840, and 850.) Component library 812 may be stored in any suitable form.

In the example embodiment, component library 812 is stored in a database associated with design automation computer system 300. In at least some examples, component library 812 also includes schematic information, safety information, pricing information, and maintenance information associated with components. In further examples, component library 812 may include estimated labor costs associated with components to identify the cost of, for example, installation and maintenance.

Design automation computer system 300 provides a retrieved plurality of first system component options to a user device based on component library 812. Upon a selection by the user, design automation computer system 300 receives a first system component selection corresponding to one of the plurality of first system component options from the user device. In the example embodiment, the first system component options represent a set of PV module options 810. In other examples, other system components may first be presented to the user.

Upon receiving a first system component selection, design automation computer system 300 may constrain the available system component options based on the first system component selection. As described above, at least some components are associated with a subset of other components and therefore force a filtering of subsequent system component options. Design automation computer system 300 accordingly retrieves a plurality of second system component options associated with the first system component selection from the component library. Design automation computer system 300 presents the plurality of second system component options to the user device and receives a second system component selection corresponding to one of the plurality of second system component options from the user device. In the example embodiment, the second system component options represent set of PV inverter options 820. In other examples, other components may secondly be presented to the user.

In a similar manner, design automation computer system 300 may present a plurality of system component options to the user device until all system component options are identified for the purposes of PV system design. In other examples, only a subset of system components is selected and design automation computer system 300 automatically identifies suitable system components for the remainder of the PV system design. In an example embodiment, a user selects a PV module 810, a PV inverter 820, and a PV combiner 830 and design automation computer system 300 automatically selects a conductor 840 and a conduit 850 and determines PV component selections 860.

Figure 9:
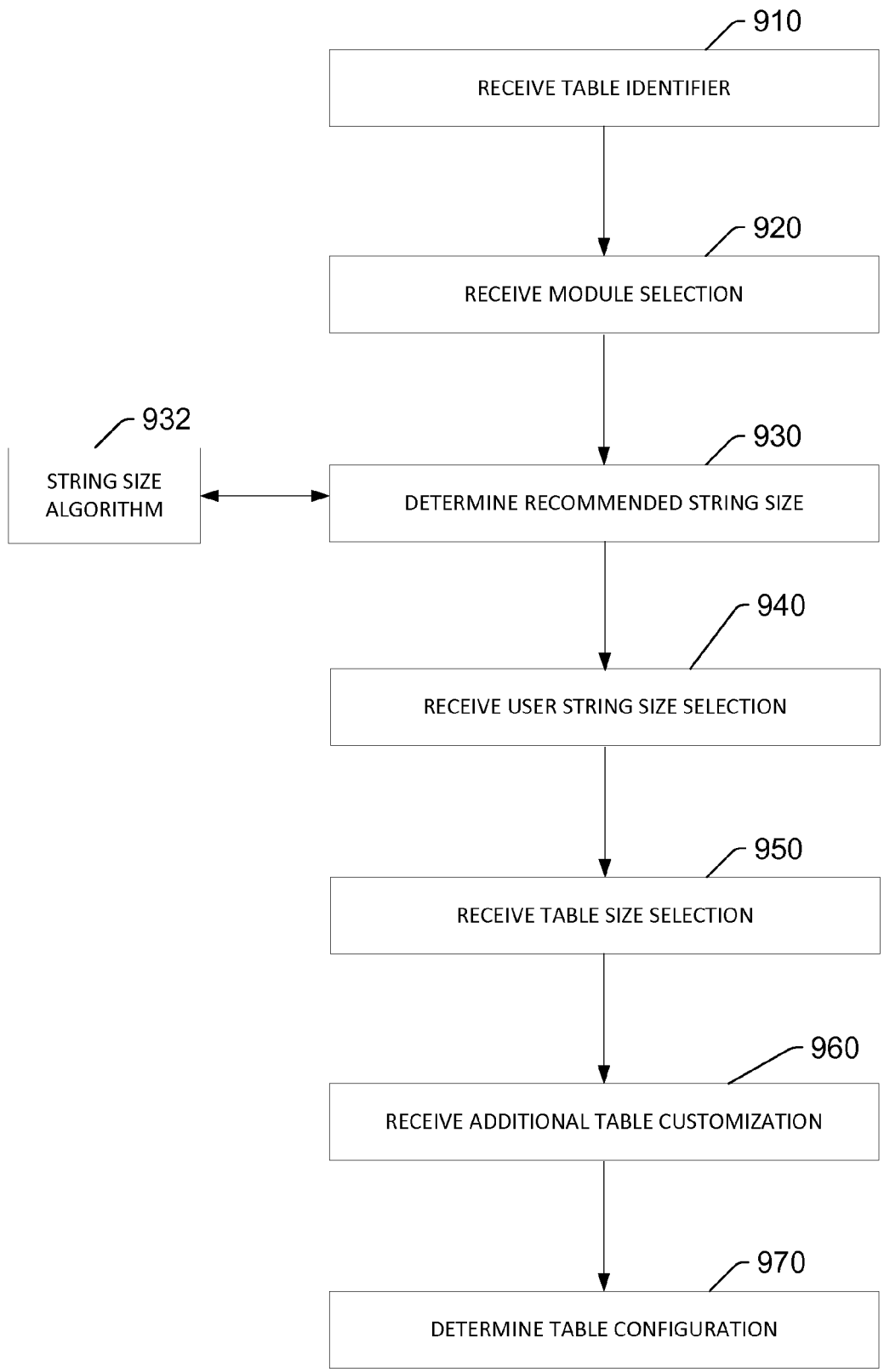

Referring to FIG. 9, design automation computer system 300 also defines a PV module layout. A PV module layout represents a physical layout of PV modules within the geographic site. In at least some examples, PV module layouts follow a hierarchical convention wherein a group of PV modules may be identified as a single unit known as a "table". A table typically has fixed dimensions in terms of PV modules. A table may further be grouped into a "block". Similarly, a block typically has fixed dimensions in terms of PV tables.

To define the PV module layout, design automation computer system 300 may receive a table identifier 910 from the user device to distinguish tables. Design automation computer system 300 further identifies a PV module type and PV inverter type for the table, previously selected by the user, by receiving module selection 920.

Design automation computer system 300 calculates or determines a recommended "string size" 930 for the table by running a string size algorithm 932. A string size represents the amount of PV modules that may be laid out in a series (e.g., a column of the table). As string sizes increase, potential open-circuit voltage outputs for the string similarly increase. Design automation computer system 300 determines the recommended string size 930 by identifying and processing a plurality of variables. Design automation computer system 300 runs string size algorithm 932 by identifying a proximate weather station (e.g., an ASHRAE station) and receiving meteorological data for the geographic site based from the proximate weather station. In the example embodiment, the received meteorological data includes record high and record low temperatures for the geographic site. Design automation computer system 300 may be accessed using an associated API or a data feed. Design automation computer system 300 also receives electrical properties including open-circuit voltage and maximum power point tracking ranges for the identified PV module and the identified PV inverter. The values for such electrical properties may be retrieved from the component library.

Based on such electrical properties and meteorological data, design automation computer system 300 determines a recommended string size for the PV module layout 930. In the example embodiment, the recommended string size is the quantity of PV modules in a string that results in an open-circuit voltage that is within the maximum power point tracking range during record low temperatures for the geographic site.

Design automation computer system 300 provides the recommended string size to the user via the user device and receives a user string size selection 940. The user may select the recommended string size or choose an alternate string size. In at least some embodiments, users may only select string sizes that result in open-circuit voltage that is within the maximum power point tracking range during record low temperatures for the geographic site.

Design automation computer system 300 also receives a selection of an amount of modules in the table 950. The selection may represent a selection of strings per table or a selection of modules per table.

The user may further define customized layout properties for the table. Design automation computer system therefore receives additional table customization 960. In at least some examples, such customized layout properties include PV module orientation, row counts, tilt angles of the PV module, and spacing between rows and columns of the PV table.

The PV string selection, the selection of an amount of modules in the table, and the customized layout properties may be described as "PV layout preferences." Based on the PV layout preferences, design automation computer system 300 determines the configuration of each PV table 970.

Figure 10:
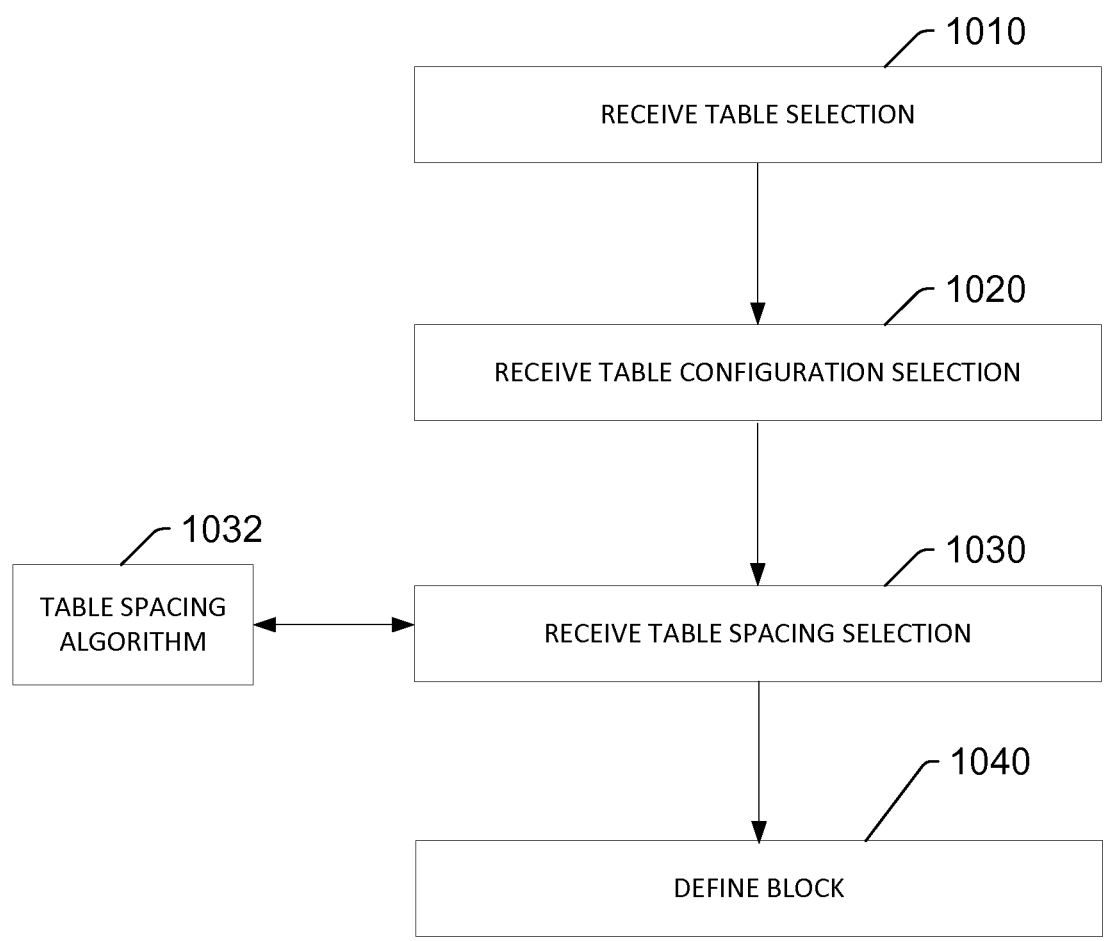

As noted above, PV tables may be grouped into PV blocks. Referring to FIG. 10, design automation computer system 300 may receive a table selection by the user to aggregate tables into blocks. Specifically, design automation computer system 300 may receive a table selection 1010 of a defined PV table and a table configuration selection 1020. The design automation computer may further receive a table spacing selection 1030. Table spacing selection 1030 may be facilitated by table spacing algorithm 1032. Such spacing may be useful to facilitate maintenance of each table. Based on such user input, design automation computer system 300 defines blocks 1040.

Figure 11:
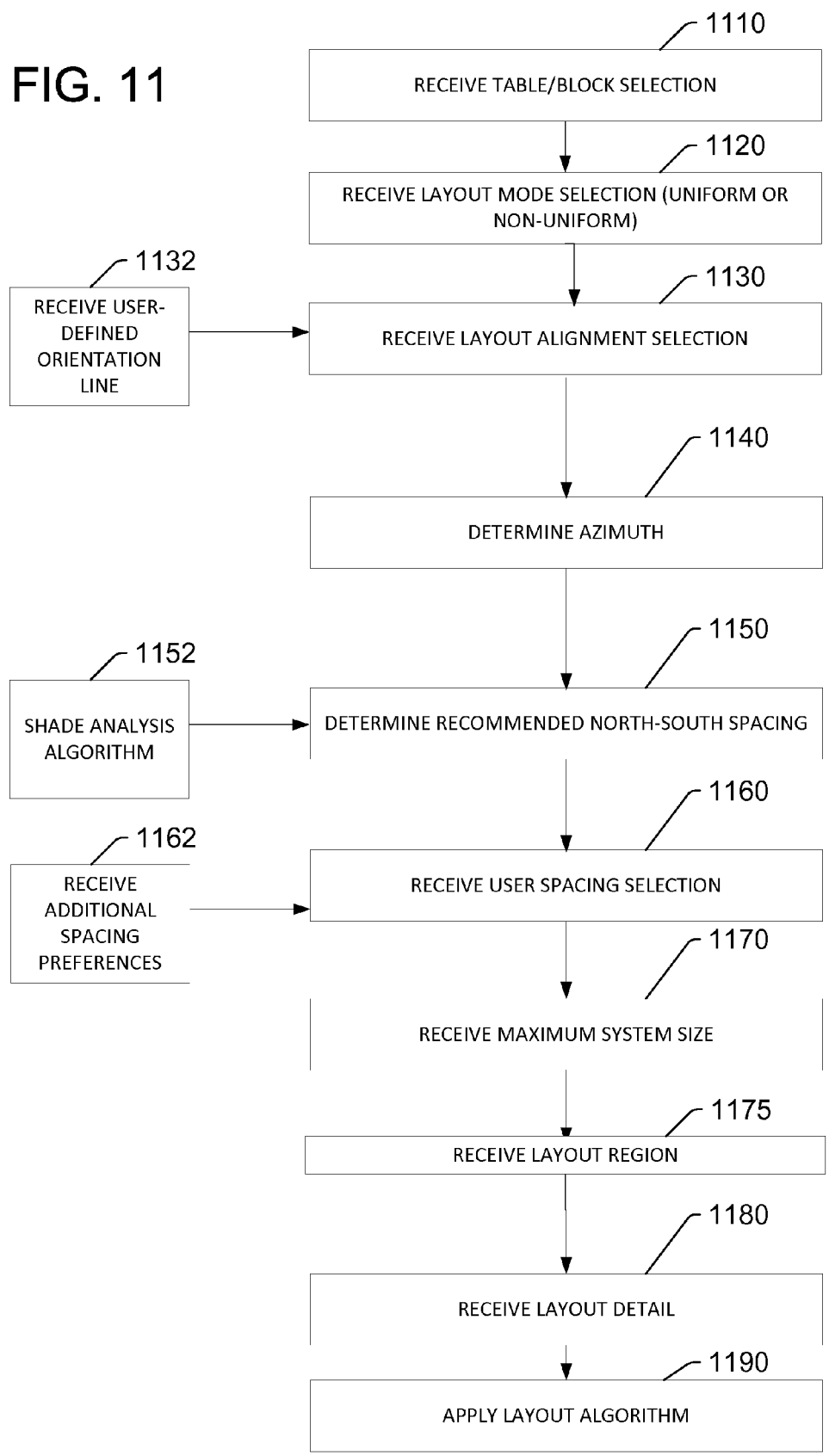

Depending upon the selected system type, design automation computer system 300 receives additional PV layout preferences. If the PV system is of a ground mount or rooftop type, design automation computer system 300 receives an additional distinct set of PV layout preferences. Referring to FIG. 11, design automation computer system 300 receives a table/block selection 1110 for the PV table or PV block being designed. Design automation computer system 300 also receives a layout mode selection 1120 indicating whether the module layout is "uniform" or "non-uniform". When the layout mode is uniform, design automation computer system 300 may substantially automate the layout by repeating PV module dimensions and spacing. When the layout mode is non-uniform, design automation computer system 300 may prompt the user device for additional layout information identifying the variances in layout. Design automation computer system 300 also receives a layout alignment selection 1130. Layout alignment selection 1130 represents the selection of the axial orientation of the PV modules by the user 1132. Specifically, design automation computer system 300 receives an axial orientation from the user device. In the example embodiment, PV layout is along a north-south axis. In an alternative embodiment, the user device may transmit any suitable axis of orientation 1132. Based on the layout alignment selection, design automation computer system 300 determines an azimuth value 1140. Design automation computer system 300 also determines a recommended spacing between rows of the PV tables 1150. The recommended spacing may be determined by running a shade analysis algorithm 1152 to simulate shadow effects caused by each row of PV modules. In the example embodiment, shade analysis algorithm 1152 is run over the winter and summer solstice periods between 10 AM and 2 PM. The row spacing is therefore determined by identifying the row spacing that allows for shade-free rows of PV modules in the simulated time periods. Design automation computer system 300 receives a user selection for row and column spacing 1160. The user may adopt the recommended spacing or select their own.

Design automation computer system 300 may receive additional spacing preferences 1162 from the user device. Such additional spacing preferences 1162 may be provided by the user for reasons including logistics and access. Design automation computer system 300 receives the user selection for row and column spacing and the additional spacing preferences as received user spacing selections. In some examples, the user may additionally provide a maximum system size 1170 to indicate that design automation computer system 300 should not layout a system exceeding this defined system size. Design automation computer system 300 also receives a layout region 1175 and receives a layout detail selection 1180 based at least partially on a received layout region 1175. Received layout region 1175 describes a physical area where layout occurs within the geographic site. As described above, users may designate particular regions for layout. Layout detail substantially represents the amount of time that design automation computer system 300 may execute to identify PV layout options. A higher value of layout detail may yield more PV layout options to consider. However, a higher value of layout detail may require more time to process. Additionally, design automation computer system 300 may receive a layout region 1175 to identify the specific portion of the geographic site that may be used for defining PV layout options. All received and determined elements 1110, 1120, 1130, 1140, 1150, 1160, 1170, and 1180 are processed and used to apply layout algorithm 1190.

Figure 12:
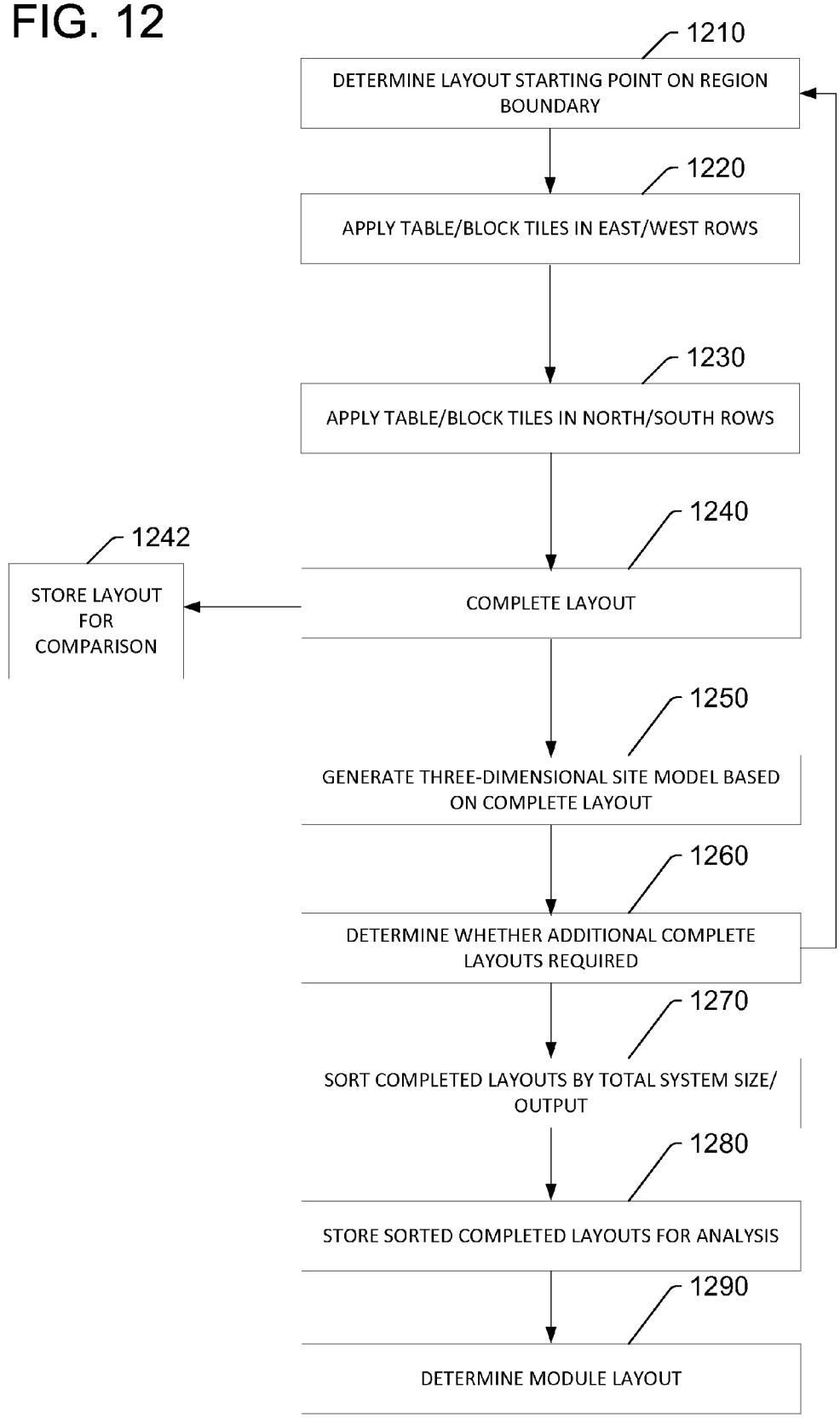

In the described example (wherein the PV system type is ground mount or rooftop), design automation computer system 300 uses the site data and the plurality of PV layout preferences to determine the PV module layout. Referring to FIG. 12, design automation computer system 300 iteratively applies a first layout algorithm to the set of site data and the plurality of PV layout preferences. Design automation computer system 300 identifies a layout starting point on the region boundary 1210. The layout starting point may be any suitable edge of the region boundary as previously defined. Design automation computer system 300 simulates laying out (or "tiling") PV blocks or tables in rows and columns based on the defined PV layout preferences. More specifically, design automation computer system 300 may apply PV tables or blocks in east-west rows 1220 and north-south columns 1230. In most examples, design automation computer system 300 avoids any obstructions, gaps, or other impediments in applying the first layout algorithm and completing layout 1240. Layout is completed 1240 when the maximum system size is reached or when the layout region is covered with PV tables or blocks in a manner consistent with PV layout preferences. Completed layout 1240 may be stored 1242 for later comparison. Completed layout 1240 is further rendered as a three-dimensional site model 1250 by design automation computer system 300.

As may be apparent, a variety of layouts may be generated depending on, for example, starting points, spacing between blocks and tables, and other variables. Depending upon the previously identified layout detail, design automation computer system 300 determines whether additional completed layouts are required 1260 and generates further layouts (returning to 1210).

On generating all completed layouts 1240, design automation computer system 300 may store the completed layouts 1280 as completed layout options. Design automation computer system 300 sorts the completed layout options 1270 by either energy output or total system size. Design automation computer system 300 facilitates a review of completed layout options by the user. The user further determines a selected PV module layout 1290 selected from the completed layout options.

Figure 13:
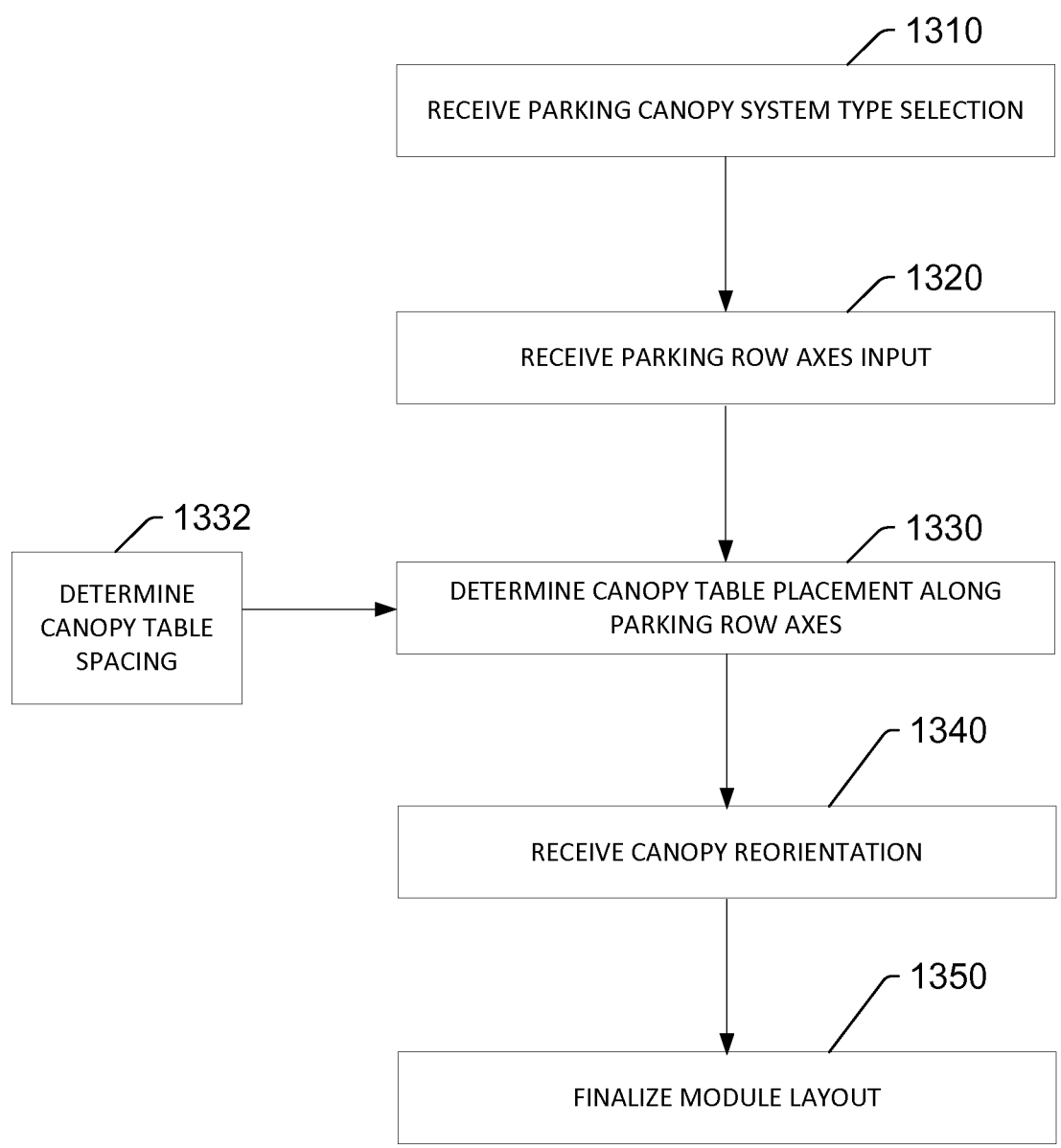

Alternatively, the selected PV system type is a parking canopy. In at least some examples, parking canopies use an alternative layout method. Referring to FIG. 13, design automation computer system 300 receives the selection of the parking canopy system type 1310. In most examples, parking canopies are laid out along a parking row axis. Design automation computer system 300 receives graphical user input identifying parking row axes 1320. Design automation computer system 300 may determine canopy table spacing (determined based on, for example, logistical and maintenance reasons) and determine suitable table placement along the defined parking row axes 1330. In some examples, design automation computer system 300 determines suitable table placement 1330 after determining canopy table spacing 1332. Specifically, design automation computer system 300 determines canopy table spacing 1332 (i.e., separation between each canopy table in the canopy system) and determines canopy table placement 1330 at least partially based on such table spacing. In at least some examples, design automation computer system 300 also receives orientation information 1340 for the canopies to allow the PV modules on the parking canopy to have greater exposure to solar irradiance. By collecting and determining these PV layout preferences, design automation computer system 300 determines the layout of blocks or tables in the parking canopy 1350. However, in at least some examples, design automation computer system 300 may utilize an iterative process of table or block layout in parking canopies similar to the process described for ground mount and rooftop system types.

Figure 14:
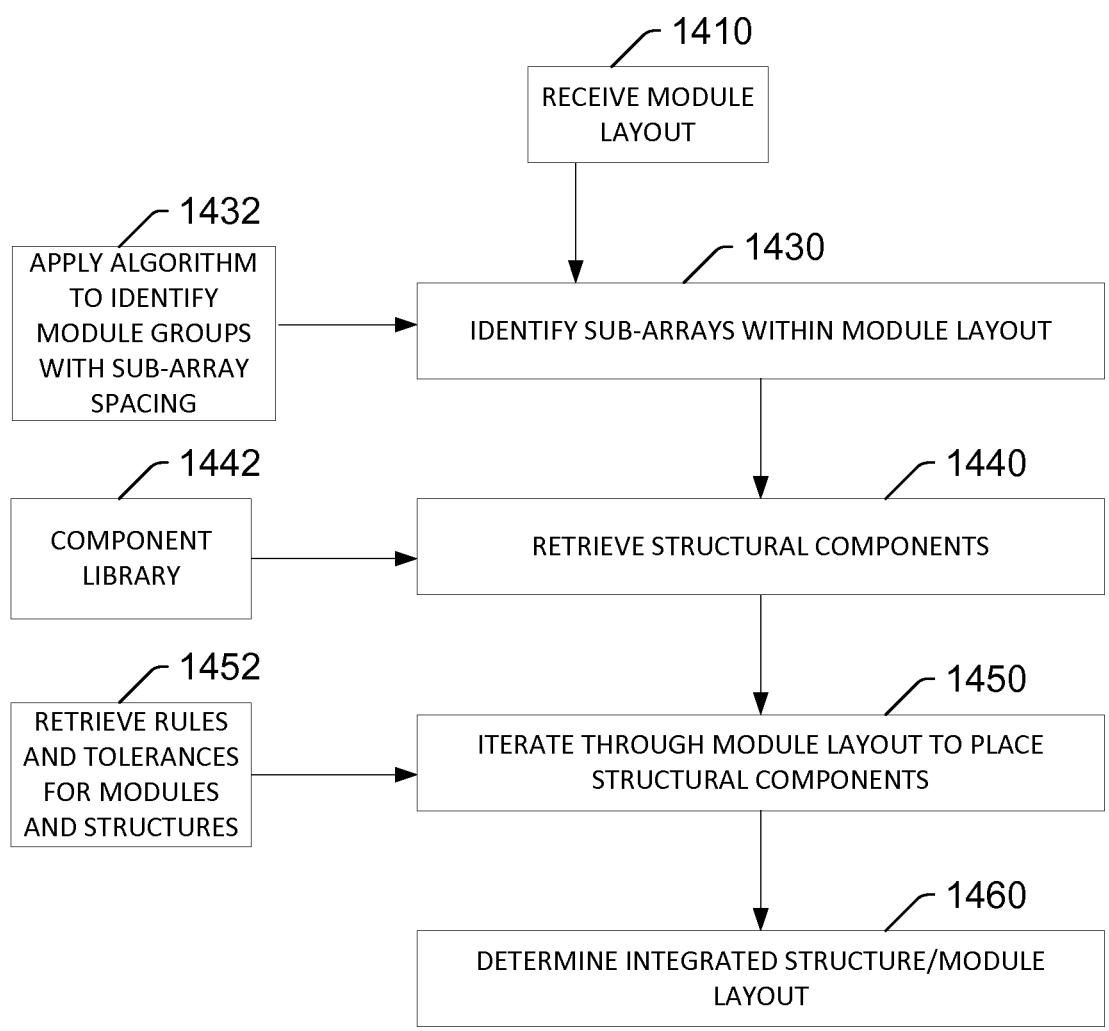

Upon determining the PV module layout, design automation computer system 300 further determines an integrated structural and modular layout. Referring to FIG. 14, the integrated structural and modular layout defines the placement of PV modules and system components and the placement and integration of any structural components needed to facilitate the PV system. Design automation computer system 300 retrieves the previously determined PV module layout 1410 and identifies sub-arrays within the PV module layout 1430. In some examples, design automation computer system 300 applies an algorithm 1432 to identify module groups with sub-array spacing and uses the results of applied algorithm 1432 to identify sub-arrays 1430 within the module layout. Sub-arrays are defined as any grouping of PV modules that have spacing between modules exceeding the standard spacing. Accordingly, design automation computer system 300 may apply a spacing algorithm to identify module groups with sub-array spacing.

Design automation computer system 300 retrieves structural components 1440 associated with the PV module layout from component library 1442. A second layout algorithm is used to iterate through the PV module layout and place structural components 1450. Structural components are placed factoring in rules and tolerances for modules and structures 1452, received from the component library. Upon completion, the second layout algorithm generates an integrated PV structure/module layout ("PV structure layout") 1460.

Figure 15:
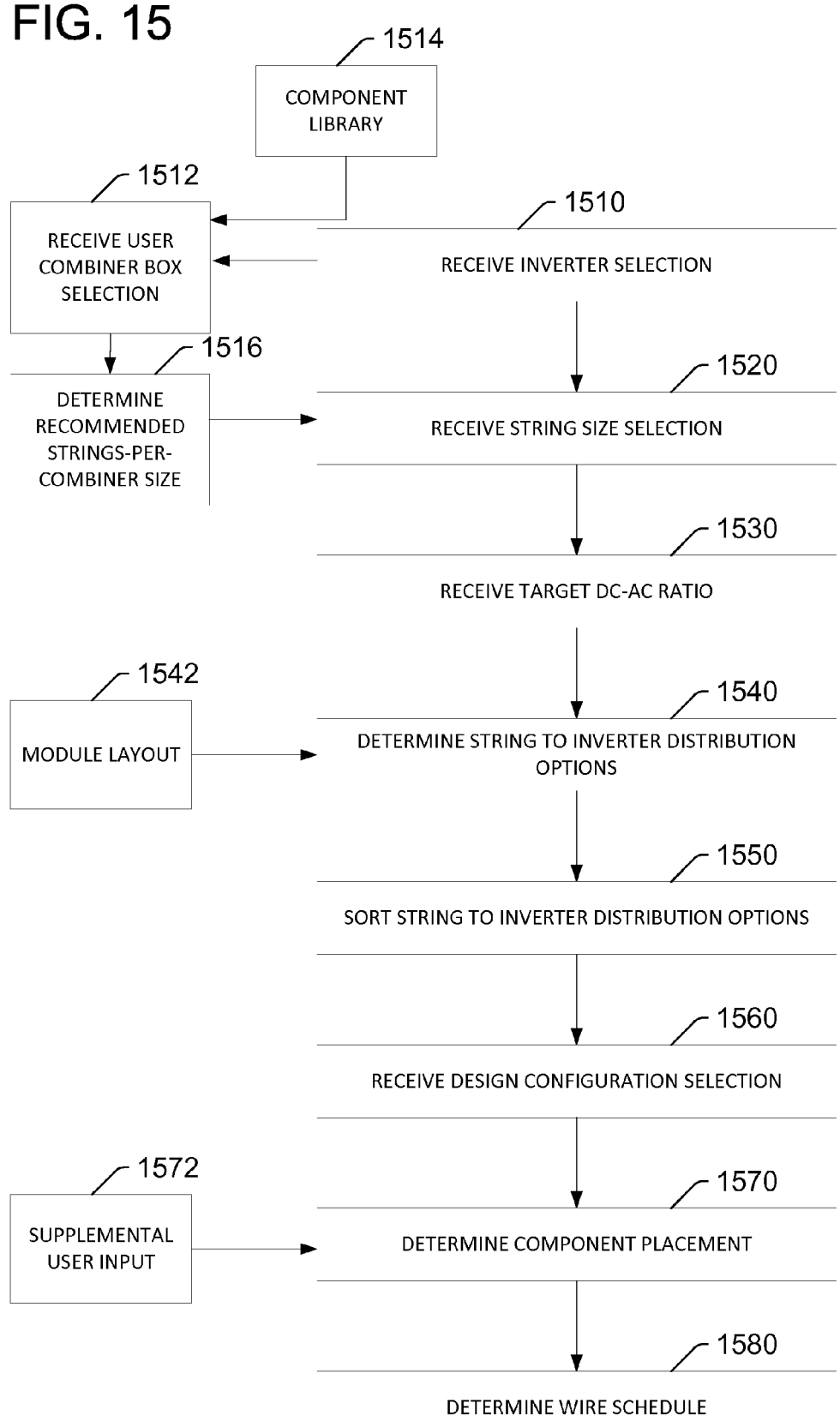

Design automation computer system 300 also determines an electrical design and an electrical layout. Referring to FIG. 15, design automation computer system 300 receives a user inverter selection 1510 indicating whether the PV system uses a central inverter.

If the user selects a central inverter, design automation computer system 300 provides a selection of PV combiner options retrieved from the component library. The user may select a PV combiner from the PV combiner options. The combiner box selection is received 1512 by design automation computer system 300. The combiner box selection provided to the user to make selection 1512 may be determined based on component library 1514. Design automation computer system 300 determines a recommended strings-per-combiner size 1516 based on the PV combiner box and the PV module.

Whether the user selects a central inverter or not, the user selects a string size selection that may be based on the recommended string size. Design automation computer system 300 receives the string size selection 1520 and prompts the user for a target ratio of direct current to alternating current (DC/AC ratio). Design automation computer system 300 receives the DC/AC ratio 1530 and determines string-to-inverter possibilities 1540. More specifically, design automation computer system 300 determines the number of strings in the PV module layout 1542, and assigns each string to an inverter. Further, design automation computer system 300 repeats the string-to-inverter matching process for a variety of inverters. Because inverter types and sizes vary, many string-to-inverter possibilities may be generated. The string-to-inverter possibilities are sorted 1550 by either DC/AC ratio or by inverter quantity. Design automation computer system 300 prompts the user for a selection of design configurations (i.e., a string-to-inverter configuration) and receives a design configuration selection 1560.

Design automation computer system 300 determines component placement 1570 within the PV structure layout and the PV module layout. In one example, the placement of components is done manually and incorporates supplemental user input 1572. In the example embodiment, the placement of components is automated. Based on the placed components and the selected design configuration, design automation computer system 300 automatically determines a wire schedule 1580. Because component placements, properties, system hierarchies, and electoral code are all know, design automation computer system 300 requires no additional input to generate the wire schedule. In some examples, design automation computer system 300 may receive specific physical paths for conductors designated by the user. Based on such input, the wire schedule may be altered or regenerated. Upon determination of the wire schedule, design automation computer system 300 may finalize the electrical design and electrical layout.

Figure 16:
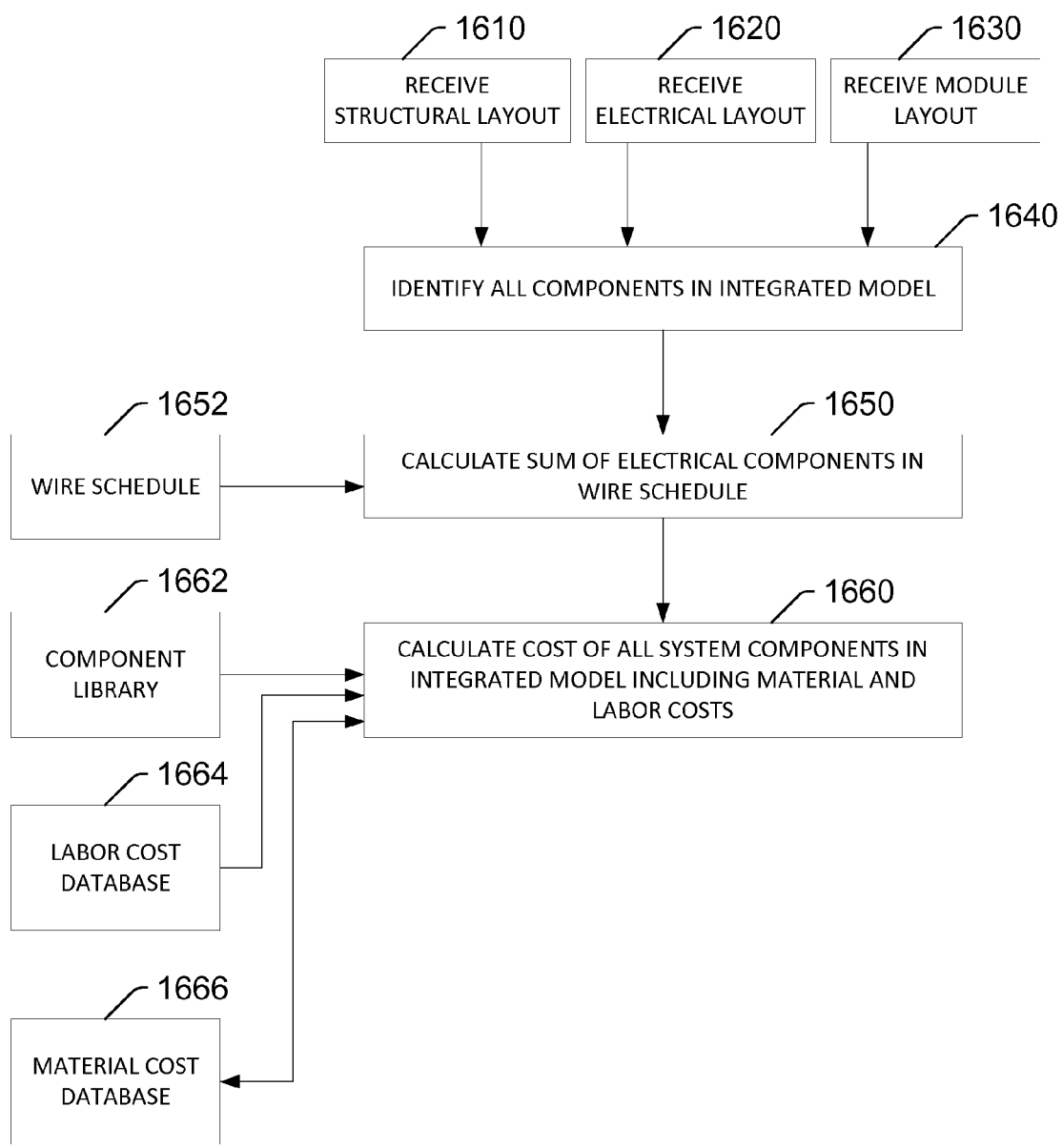

Design automation computer system 300 additionally may determine a list of components, materials, sub-assemblies, intermediate assemblies, sub-components, parts and the quantities to generate the PV system. This list may be referred to as the bill of materials. Referring to FIG. 16, design automation computer system 300 receives the previously determined structural layout 1610, electrical layout 1620, and module layout 1630 and generates an integrated model. Design automation computer system 300 automatically identifies all components within the integrated model 1640. Design automation computer system 300 also retrieves wire schedule 1652 and calculates the total of all electrical components included in the wire schedule 1650. Design automation computer system 300 additionally retrieves information regarding each component from the component library 1662. In some examples, design automation computer system 300 also receives labor cost data regarding installation and service costs for the area of the PV system from a labor cost database 1664. Design automation computer system 300 additionally receives material cost data for the components and electrical components from a material cost database 1666. Design automation computer system 300 accordingly calculates 1660 the cost of all system components in the integrated model including material and labor costs.

Figure 17:
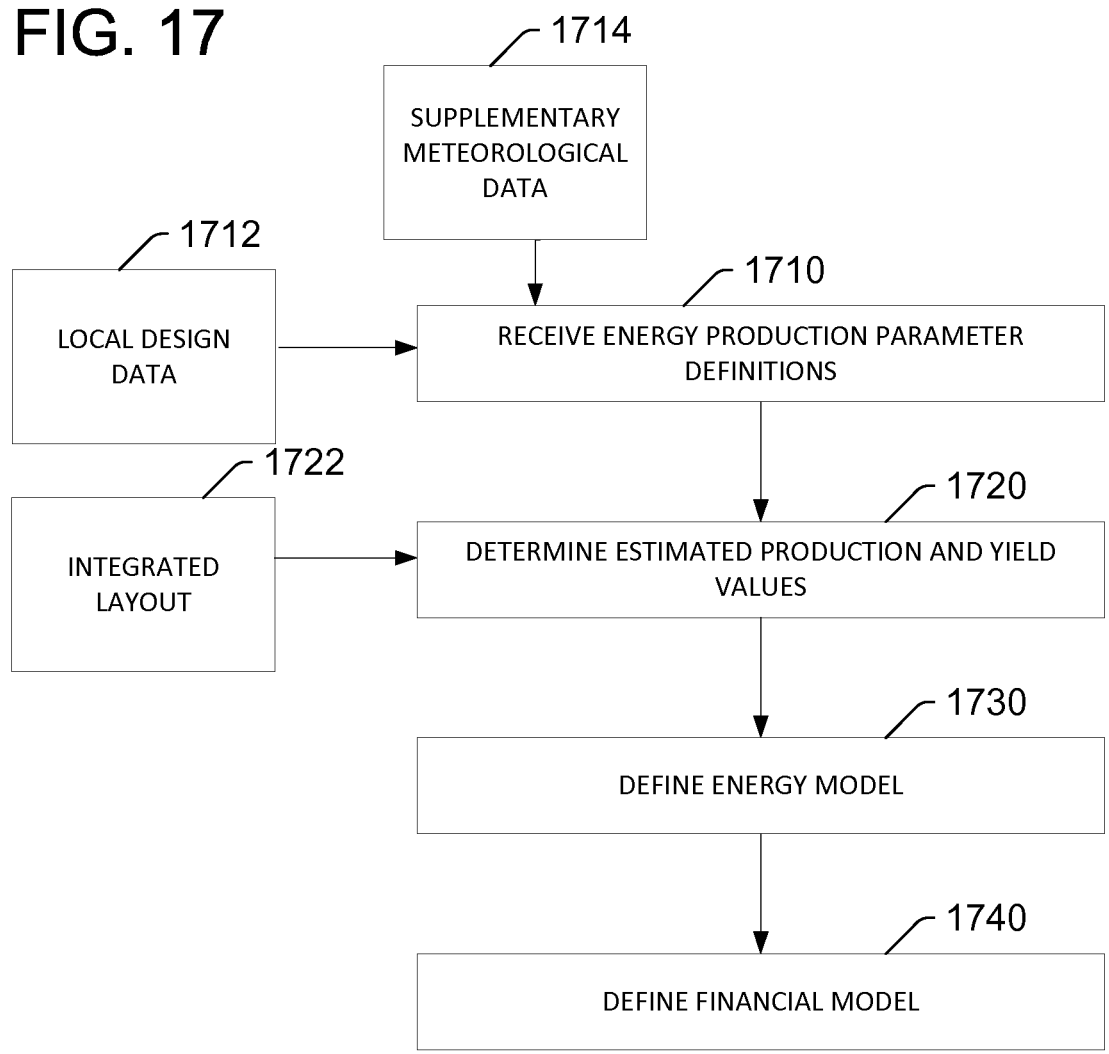
Figure 18:
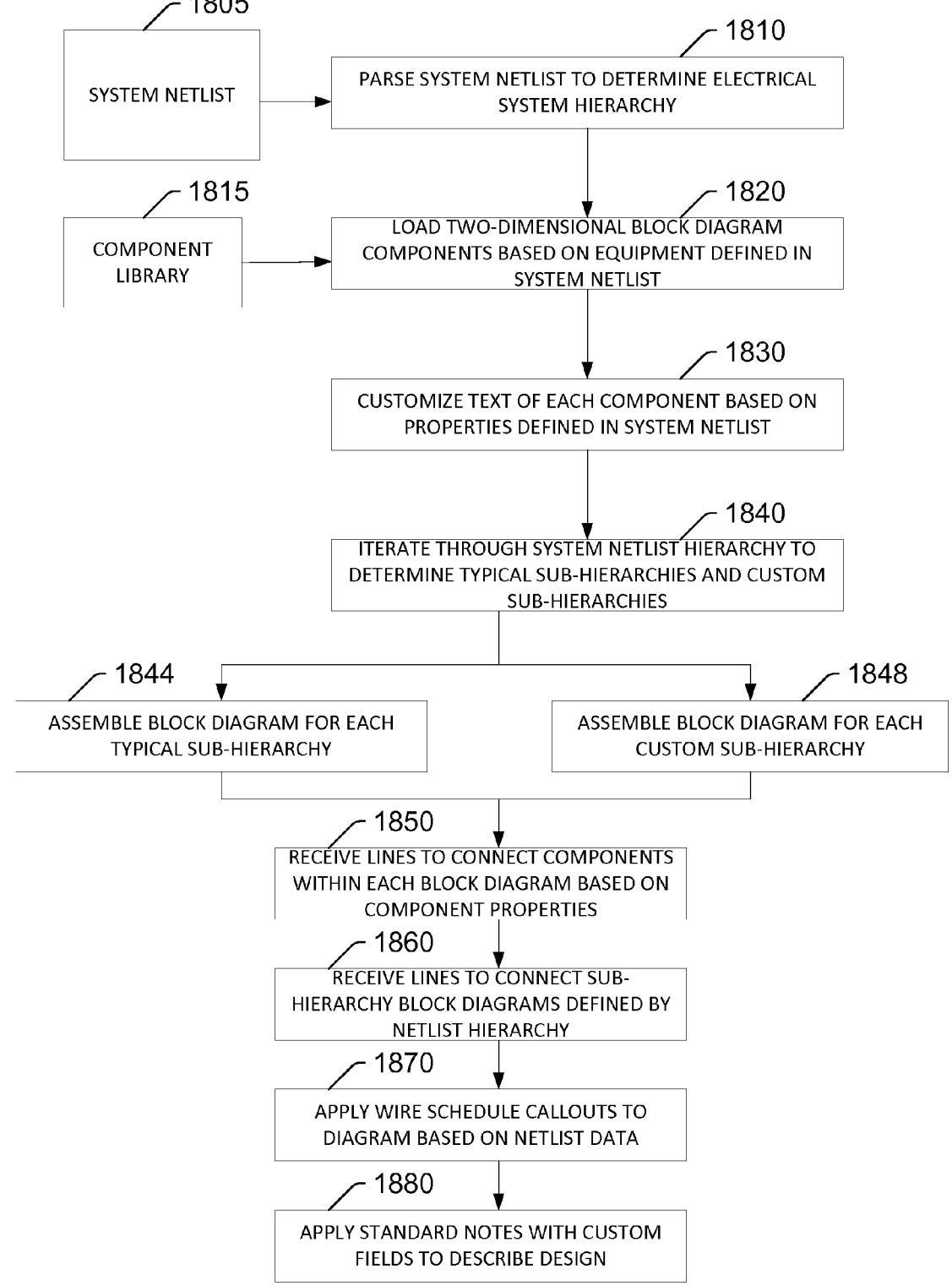
Figure 19:
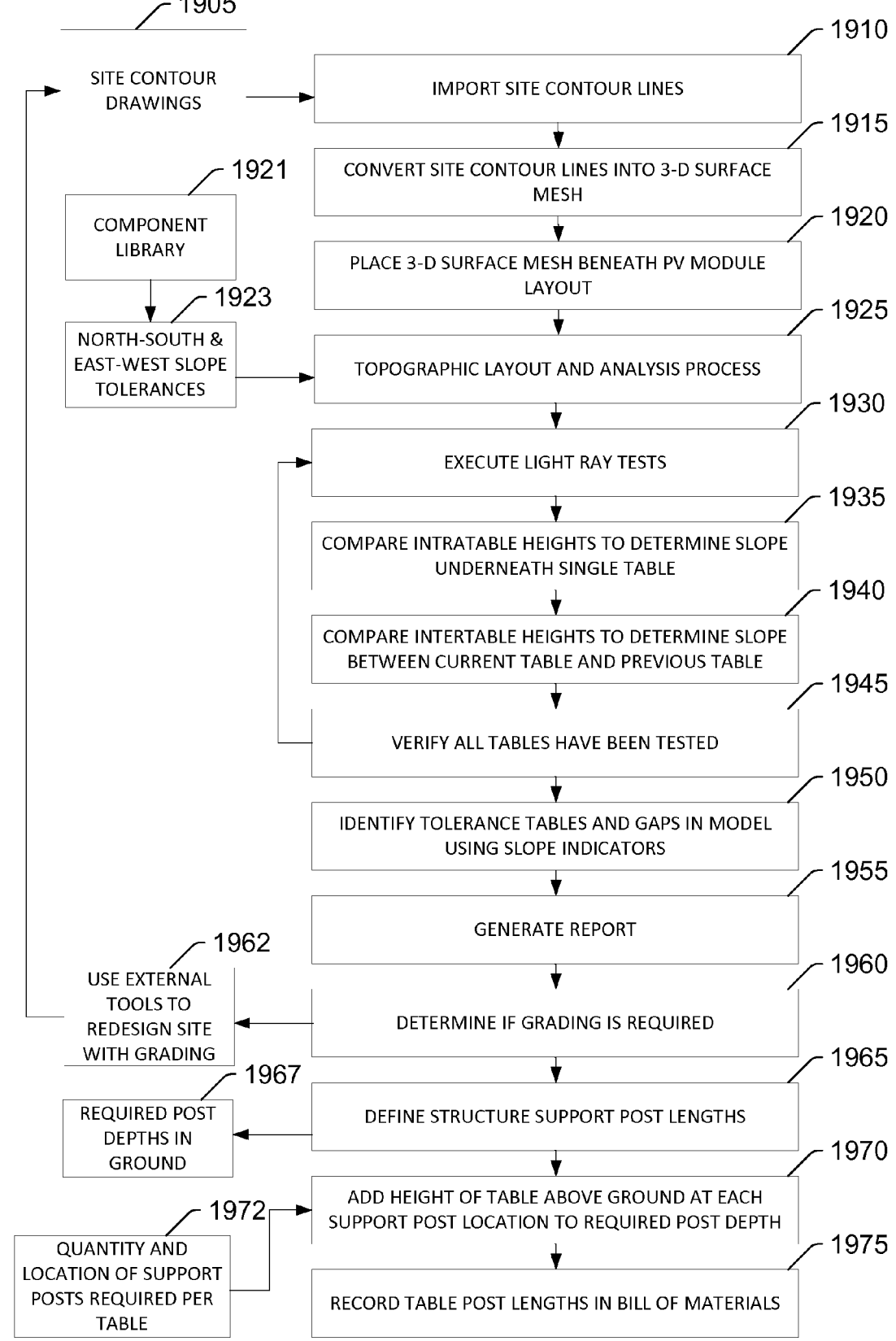

Design automation computer system 300 also defines an energy production model. Referring to FIG. 17, design automation computer system 300 receives energy production parameter definitions 1710 based on weather data and simulation specifications. Energy production parameter definitions 1710 may accordingly incorporate local design data 1712 and supplementary meteorological data 1714. Design automation computer system 300 additionally receives the integrated layout 1722 and determines an estimated energy production and yield 1720. The estimated energy production and yield is used to determine an overall energy model 1730.

Design automation computer system 300 may further receive energy pricing data and determine a financial model 1740. By incorporating the bill of materials and cost information, the financial model may include a cost estimation and a profitability analysis.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A computer-implemented method for designing a photovoltaic (PV) system, the method implemented by a design automation computer system in communication with a memory, the method comprising:
    receiving a set of site data, wherein the site data includes a set of location identifiers;
    determining a set of location design characteristics based on the set of site data;
    retrieving a set of structural product rules;
    identifying a subset of structural product rules associated with the set of location design characteristics;
    receiving a system type selection;
    receiving a plurality of system component selections;
    receiving a plurality of PV layout preferences;
    determining, at the design automation computer system, a PV module layout by iteratively applying a first layout algorithm to the set of site data and the plurality of PV layout preferences, the PV module layout defining a placement of a plurality of PV modules of a PV system;
    determining a structural layout, an electrical design, and an electrical layout based on the PV module layout;
    refining the structural layout based on the subset of structural product rules;
    determining a bill of materials based on the PV module layout, the structural layout, and the electrical layout;
    defining a PV system model using the structural layout, the electrical design, the electrical layout, the PV module layout, and the bill of materials; and
    displaying at least a portion of the PV system model on a visual display.

2. The method of claim 1, further comprising:
    receiving a set of boundary offsets associated with the set of site data;
    receiving a set of obstruction definitions associated with the set of site data, the set of obstruction definitions including a set of obstruction heights and a set of obstruction offsets;
    determining a set of shadow setbacks based on the set of obstruction definitions; and
    determining the PV module layout based on the set of shadow setbacks such that the shadow setbacks define a plurality of regions where the plurality of PV modules cannot be placed.

3. The method of claim 2, wherein determining the set of shadow setbacks further comprises:
    identifying a set of obstructions based on the set of obstruction definitions;
    projecting a set of shadows for a plurality of time periods based on the set of obstructions and a projected sun location for each of the plurality of time periods; and
    integrating the set of shadows into an integrated shadow setback area.

4. The method of claim 1, wherein receiving the plurality of system component selections further comprises:
    providing a plurality of first component options to a user device based on a component library;
    receiving a first component selection corresponding to one of the plurality of first component options, from the user device;
    retrieving, from the component library, a plurality of second component options associated with the first component selection;
    providing the plurality of second component options to the user device; and
    receiving a second component selection corresponding to one of the plurality of second component options, from the user device.

5. The method of claim 1, wherein receiving the system type selection further comprises:
    receiving one of a parking canopy type selection, a ground mount type selection, and a rooftop type selection;
    providing the plurality of system component selections based on the system type selection; and
    receiving the plurality of PV layout preferences based on the system type selection.

6. The method of claim 1, further comprising:
    determining an energy simulation, a cost estimation, and a profitability analysis based on the completed PV system design, and the bill of materials.

7. The method of claim 1, further comprising:
    identifying a plurality of strings in the PV module layout;
    identifying a plurality of inverters in the PV module layout; and
    assigning each of the plurality of strings in the PV module layout to an associated inverter of the plurality of inverters.

8. The method of claim 1, further comprising:
    identifying a plurality of electrical properties associated with the PV module layout;

identifying a plurality of meteorological data associated with the location identifiers; and
determining a recommended string size based on the plurality of meteorological data and the plurality of electrical properties.

9. A design automation computer system used to design a photovoltaic (PV) system, the design automation computer system comprising:
a processor; and
a memory coupled to said processor, said processor configured to:
receive a set of site data, wherein the site data includes a set of location identifiers;
determining a set of location design characteristics based on the set of site data;
retrieving a set of structural product rules;
identifying a subset of structural product rules associated with the set of location design characteristics;
receive a system type selection;
receive a plurality of system component selections;
receive a plurality of PV layout preferences;
determine a PV module layout by iteratively applying a first layout algorithm to the set of site data and the plurality of PV layout preferences, the PV module layout defining a placement of a plurality of PV modules of a PV system;
determine a structural layout, an electrical design, and an electrical layout based on the PV module layout;
refining the structural layout based on the subset of structural product rules;
determine a bill of materials based on the PV module layout, the structural layout, and the electrical layout;
define a PV system model using the structural layout, the electrical design, the electrical layout, the PV module layout, and the bill of materials; and
displaying at least a portion of the PV system model on a visual display.

10. The design automation computer system of claim 9, further configured to:
receive a set of boundary offsets associated with the set of site data;
receive a set of obstruction definitions associated with the set of site data, the set of obstruction definitions including a set of obstruction heights and a set of obstruction offsets;
determine a set of shadow setbacks based on the set of obstruction definitions; and
determine the PV module layout based on the set of shadow setbacks such that the shadow setbacks define a plurality of regions where the plurality of PV modules cannot be placed.

11. The design automation computer system of claim 10, further configured to:
identify a set of obstructions based on the set of obstruction definitions;
project a set of shadows for a plurality of time periods based on the set of obstructions and a projected sun location for each of the plurality of time periods; and
integrate the set of shadows into an integrated shadow setback area.

12. The design automation computer system of claim 9, further configured to:
provide a plurality of first component options to a user device based on a component library;
receive a first component selection corresponding to one of the plurality of first component options, from the user device;
retrieve, from the component library, a plurality of second component options associated with the first component selection;
provide the plurality of second component options to the user device; and
receive a second component selection corresponding to one of the plurality of second component options, from the user device.

13. The design automation computer system of claim 9, further configured to:
receive one of a parking canopy type selection, a ground mount type selection, and a rooftop type selection;
provide the plurality of system component selections based on the system type selection; and
receive the plurality of PV layout preferences based on the system type selection.

14. The design automation computer system of claim 9, further configured to:
determine an energy simulation, a cost estimation, and a profitability analysis based on the structural layout, the electrical design, the electrical layout, the PV module layout, and the bill of materials.

15. The design automation computer system of claim 9, further configured to:
identify a plurality of strings in the PV module layout;
identify a plurality of inverters in the PV module layout; and
assign each of the plurality of strings in the PV module layout to an associated inverter of the plurality of inverters.

16. The design automation computer system of claim 9, further configured to:
identify a plurality of electrical properties associated with the PV module layout;
identify a plurality of meteorological data associated with the location identifiers; and
determine a recommended string size based on the plurality of meteorological data and the plurality of electrical properties.

17. Non-transitory computer-readable storage media for designing a photovoltaic (PV) system, the computer-readable storage media having computer-executable instructions embodied thereon, wherein, when executed by at least one processor, the computer-executable instructions cause the processor to:
receive a set of site data, wherein the site data includes a set of location identifiers;
determining a set of location design characteristics based on the set of site data;
retrieving a set of structural product rules;
identifying a subset of structural product rules associated with the set of location design characteristics;
receive a system type selection;
receive a plurality of system component selections;
receive a plurality of PV layout preferences;
determine a PV module layout by iteratively applying a first layout algorithm to the set of site data and the plurality of PV layout preferences, the PV module layout defining a placement of a plurality of PV modules of a PV system;
determine a structural layout, an electrical design, and an electrical layout based on the PV module layout;
refining the structural layout based on the subset of structural product rules;
determine a bill of materials based on the PV module layout, the structural layout, and the electrical layout;

define a PV system model using the structural layout, the electrical design, the electrical layout, the PV module layout, and the bill of materials; and displaying at least a portion of the PV system model on a visual display.

18. The computer-readable storage media in accordance with claim 17, wherein the computer-executable instructions cause the processor to:

receive a set of boundary offsets associated with the set of site data;

receive a set of obstruction definitions associated with the set of site data, the set of obstruction definitions including a set of obstruction heights and a set of obstruction offsets;

determine a set of shadow setbacks based on the set of obstruction definitions; and determine the PV module layout based on the set of shadow setbacks such that the shadow setbacks define a plurality of regions where the plurality of PV modules cannot be placed.

19. The computer-readable storage media in accordance with claim 18, wherein the computer-executable instructions cause the processor to:

identify a set of obstructions based on the set of obstruction definitions;

project a set of shadows for a plurality of time periods based on the set of obstructions and a projected sun location for each of the plurality of time periods; and integrate the set of shadows into an integrated shadow setback area.

20. The computer-readable storage media in accordance with claim 17, wherein the computer-executable instructions cause the processor to:

provide a plurality of first component options to a user device based on a component library;

receive a first component selection corresponding to one of the plurality of first component options, from the user device;

retrieve, from the component library, a plurality of second component options associated with the first component selection;

provide the plurality of second component options to the user device; and receive a second component selection corresponding to one of the plurality of second component options, from the user device.

21. The computer-readable storage media in accordance with claim 17, wherein the computer-executable instructions cause the processor to:

receive one of a parking canopy type selection, a ground mount type selection, and a rooftop type selection;

provide the plurality of system component selections based on the system type selection; and receive the plurality of PV layout preferences based on the system type selection.

22. A computer-implemented method for constructing a photovoltaic (PV) system, the method implemented by a design automation computer system in communication with a memory, the method comprising:

receiving a set of site data, wherein the site data includes a set of location identifiers;

determining a set of location design characteristics based on the set of site data;

retrieving a set of structural product rules;

identifying a subset of structural product rules associated with the set of location design characteristics;

receiving a system type selection;

receiving a plurality of system component selections;

receiving a plurality of PV layout preferences;

determining, at the design automation computer system, a PV module layout by iteratively applying a first layout algorithm to the set of site data and the plurality of PV layout preferences, the PV module layout defining a placement of a plurality of PV modules of a PV system;

determining a structural layout, an electrical design, and an electrical layout based on the PV module layout;

refining the structural layout based on the subset of structural product rules;

determining a bill of materials based on the PV module layout, the structural layout, and the electrical layout;

creating a plurality of PV system options using the structural layout, the electrical design, the electrical layout, the PV module layout, and the bill of materials;

providing the plurality of PV system options to a user device for display on a visual display of the user device;

receiving a PV system selection corresponding to one of the plurality of PV system options; and constructing the PV system based on the PV system selection.

* * * * *